(12) United States Patent　　(10) Patent No.: US 10,139,456 B2
Nakatani et al.　　(45) Date of Patent: Nov. 27, 2018

(54) MEMS SENSOR, METHOD FOR MANUFACTURING THE SAME, AND MEMS PACKAGE INCLUDING THE SAME

(71) Applicant: ROHM CO., LTD., Kyoto (JP)

(72) Inventors: Goro Nakatani, Kyoto (JP); Yoshihiro Tada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 560 days.

(21) Appl. No.: 14/713,605

(22) Filed: May 15, 2015

(65) Prior Publication Data

US 2015/0331066 A1　　Nov. 19, 2015

(30) Foreign Application Priority Data

May 16, 2014　(JP) ................................ 2014-102814

(51) Int. Cl.
| | | |
|---|---|---|
| G01C 19/56 | (2012.01) |
| G01P 15/125 | (2006.01) |
| H01L 29/84 | (2006.01) |
| G01R 33/028 | (2006.01) |
| G01R 33/00 | (2006.01) |
| G01R 33/07 | (2006.01) |

(52) U.S. Cl.
CPC ...... *G01R 33/0286* (2013.01); *G01R 33/0052* (2013.01); *G01R 33/07* (2013.01)

(58) Field of Classification Search
CPC . G01R 33/0286; G01R 33/0052; G01R 33/07
See application file for complete search history.

(56) References Cited

U.S. PATENT DOCUMENTS

| | | | |
|---|---|---|---|
| 2010/0224980 A1* | 9/2010 | Chahal | B81B 7/007 257/690 |
| 2012/0139064 A1 | 6/2012 | Nakatani et al. | |
| 2014/0290365 A1* | 10/2014 | Ju | G01C 19/5719 73/514.39 |
| 2016/0269000 A1* | 9/2016 | Shimizu | H01L 21/56 |

FOREIGN PATENT DOCUMENTS

| | | |
|---|---|---|
| JP | 2012-127691 A | 7/2012 |
| JP | 2012-215498 A | 11/2012 |

* cited by examiner

*Primary Examiner* — David M Gray
*Assistant Examiner* — Michael Harrison
(74) *Attorney, Agent, or Firm* — Rabin & Berdo, P.C.

(57) ABSTRACT

A MEMS sensor according to the present invention includes a base substrate including a displaceably supported movable portion and a lid substrate covering the movable portion and functioning as a magnetic sensor that detects magnetism by making use of the Hall effect.

46 Claims, 39 Drawing Sheets

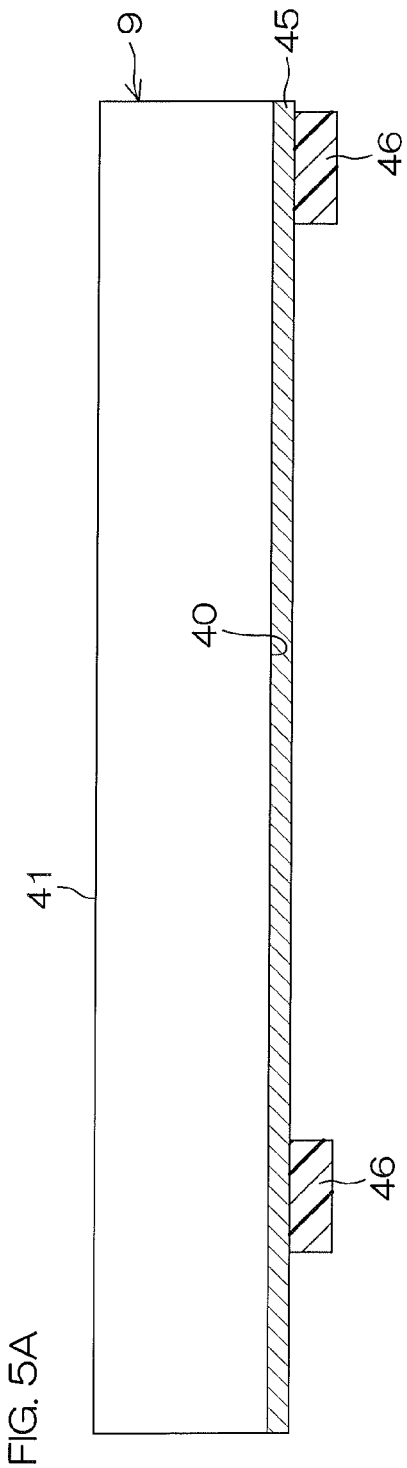

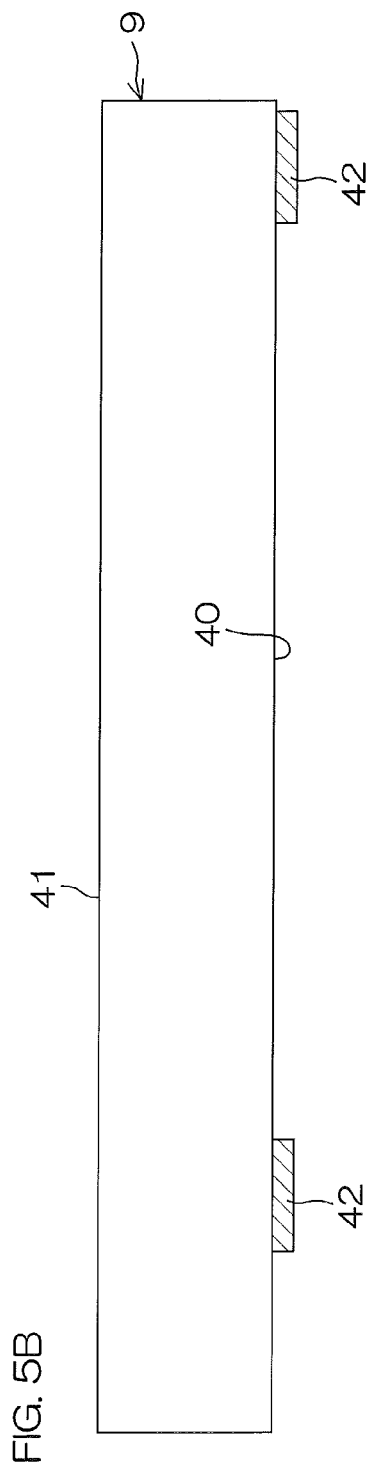

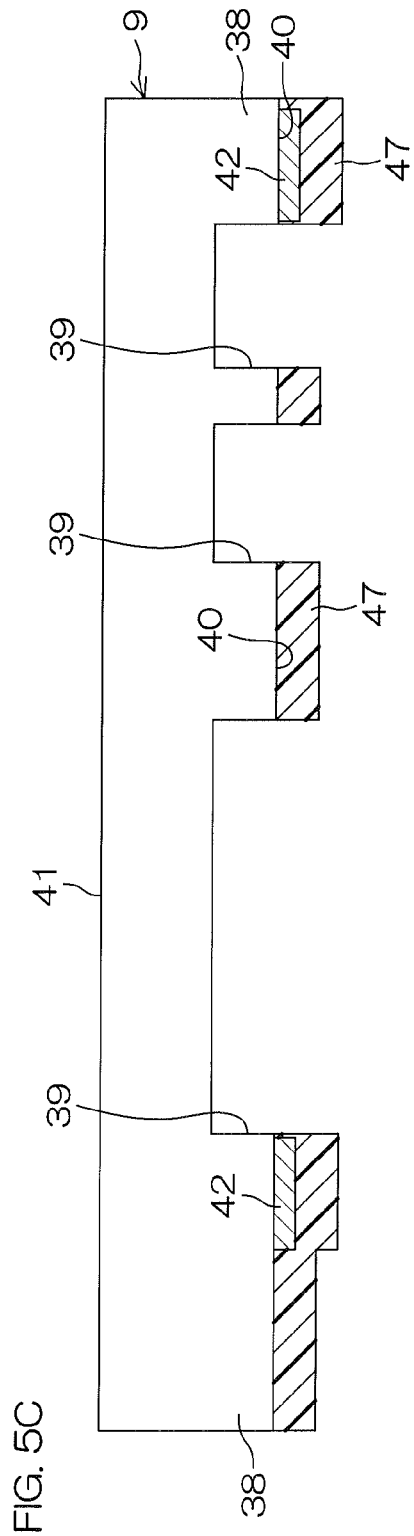

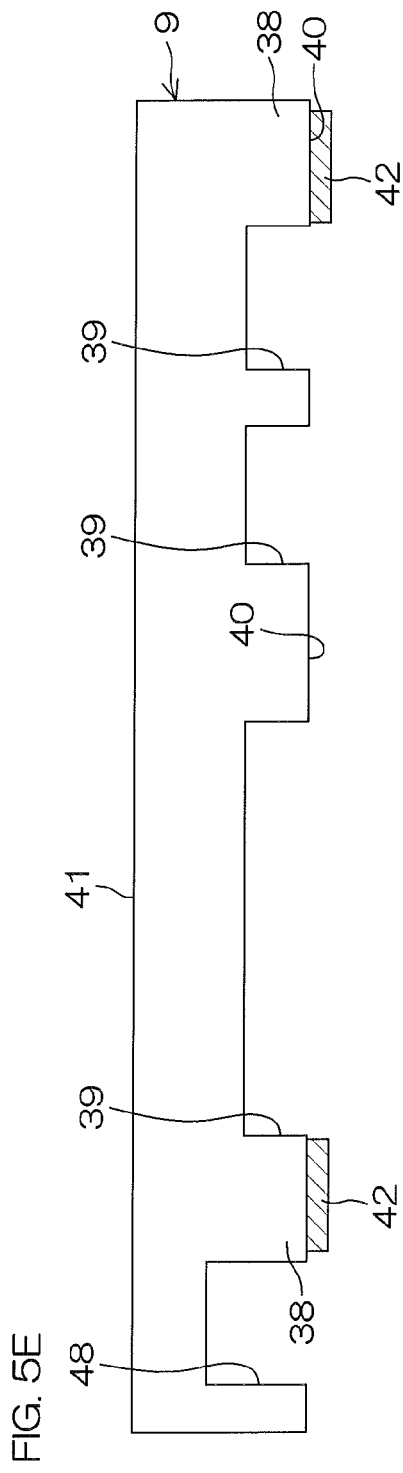

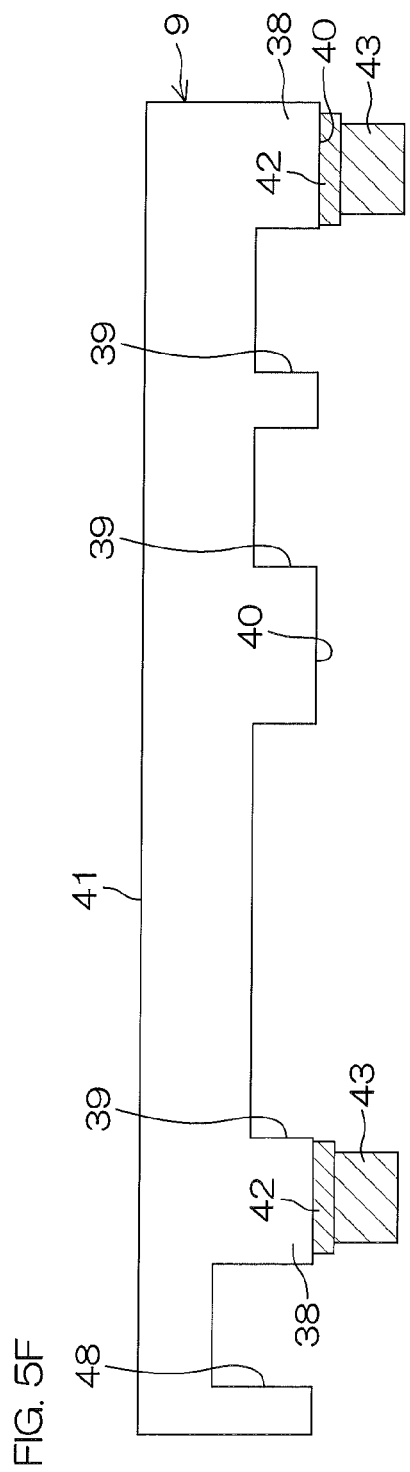

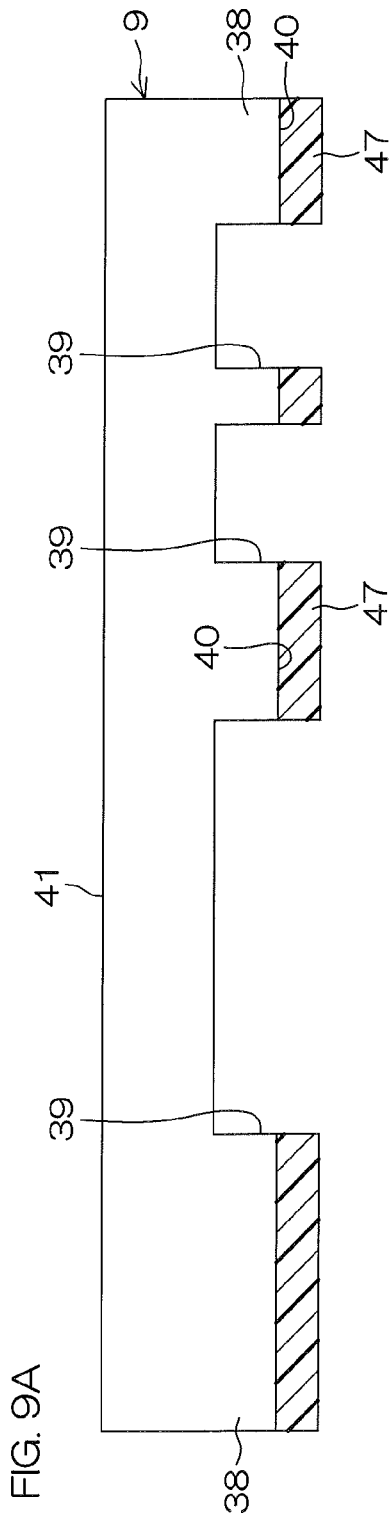

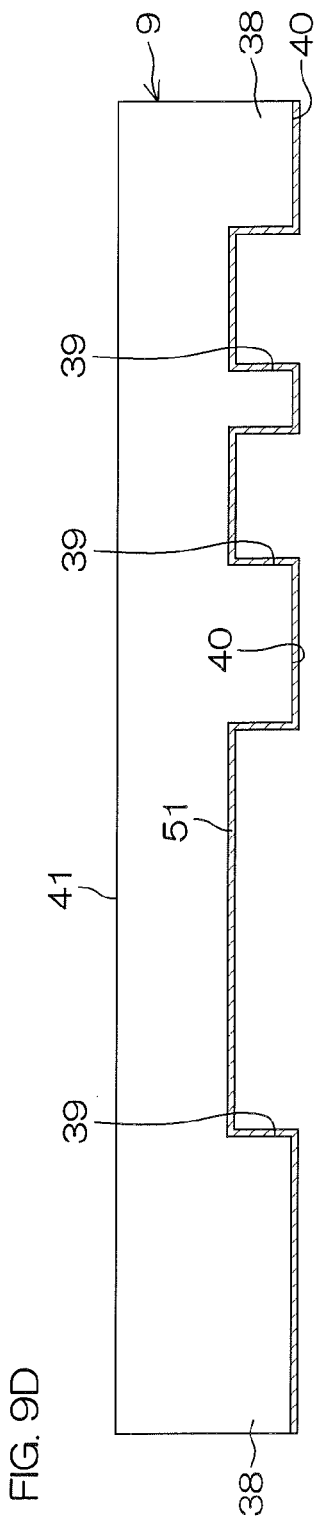

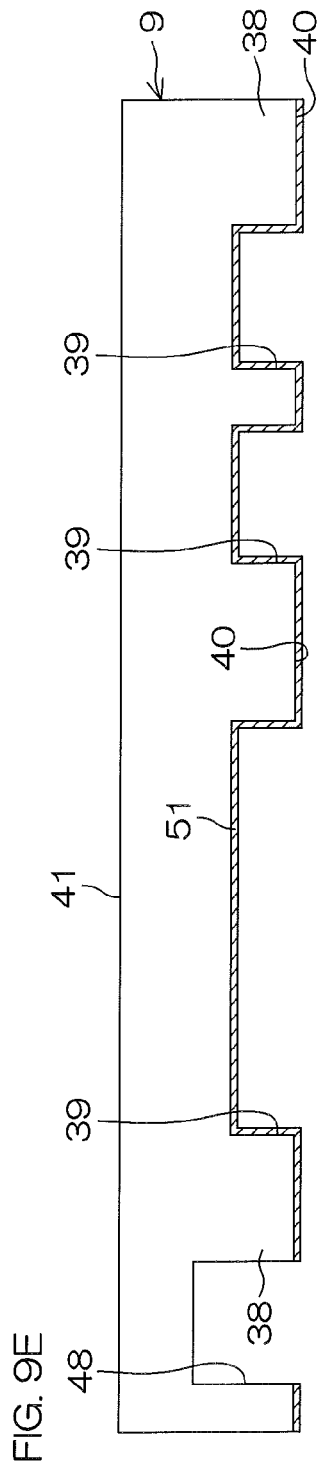

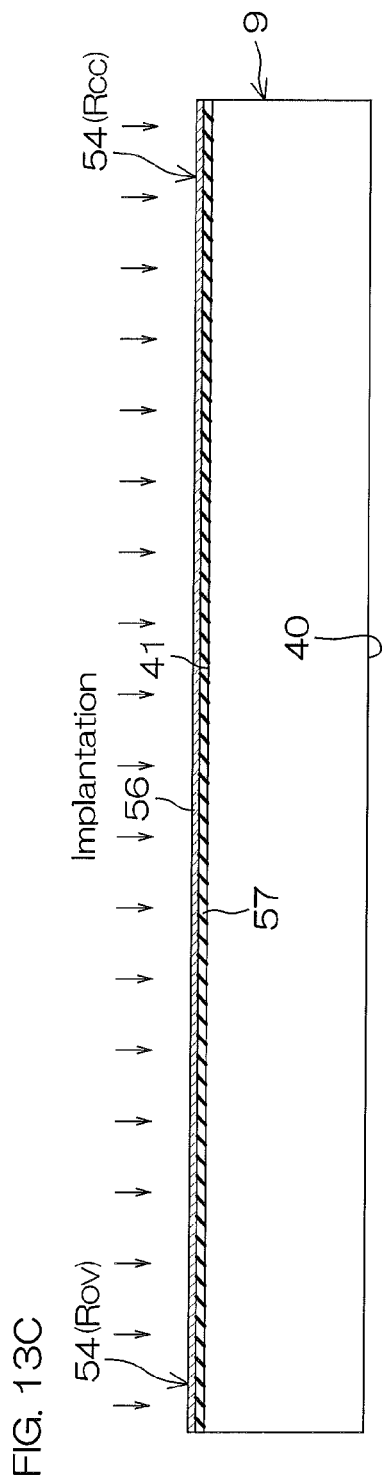

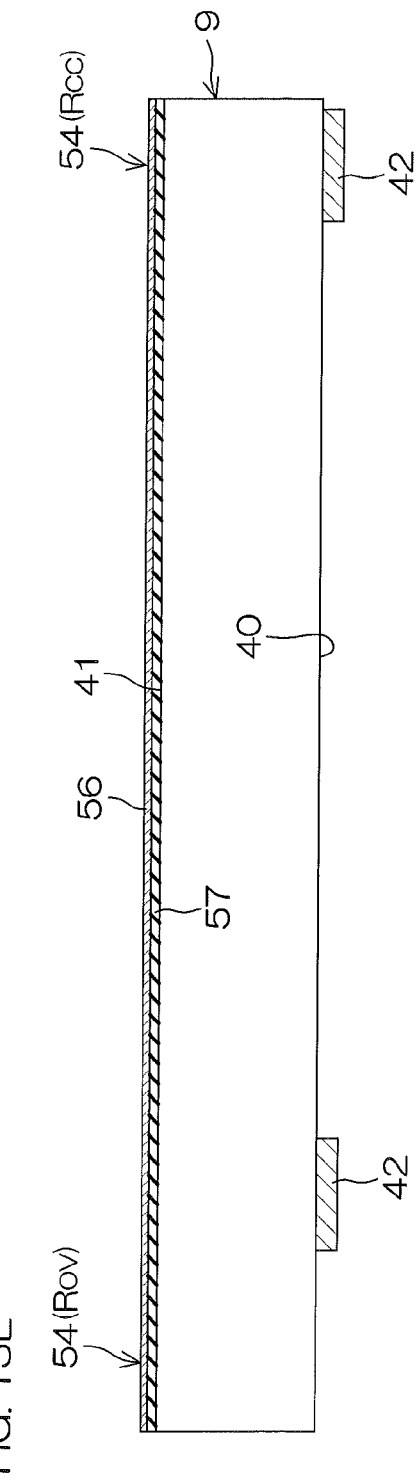

MEMS SENSOR, METHOD FOR MANUFACTURING THE SAME, AND MEMS PACKAGE INCLUDING THE SAME

CROSS-REFERENCE TO RELATED APPLICATIONS

The present application corresponds to Japanese Patent Application No. 2014-102814 filed in the Japan Patent Office on May 16, 2014, and the entire disclosure of this application is incorporated herein by reference.

FIELD OF THE INVENTION

The present invention relates to a MEMS sensor, a method for manufacturing the same, and a MEMS package including the same.

BACKGROUND ART

Patent Document 1 (Japanese Patent Application Publication No. 2012-127691) discloses an angular velocity sensor that includes abase substrate, a sensor portion provided at a central portion of the base substrate, electrodes pads disposed at a side of the sensor portion on the base substrate, and a lid substrate covering the sensor portion.

BRIEF SUMMARY OF THE INVENTION

Conventionally in using a MEMS sensor, such as an acceleration sensor or an angular velocity sensor, etc., in combination with a magnetic sensor, no measures in particular have been proposed in regard to how such sensors are to be combined.

An object of the present invention is to provide a MEMS sensor additionally having functions of a magnetic sensor in a single chip and a method for manufacturing the same.

Another object of the present invention is to provide a MEMS package that includes the MEMS sensor of the present invention.

BRIEF DESCRIPTION OF THE DRAWINGS

FIG. 5A to FIG. 5I are diagrams of portions of the process for manufacturing the acceleration sensor of FIG. 2.

FIG. 9A to FIG. 9I are diagrams of portions of the process for manufacturing the acceleration sensor of FIG. 7.

FIG. 13A to FIG. 13K are diagrams of portions of the process for manufacturing the acceleration sensor of FIG. 11.

DETAILED DESCRIPTION OF THE INVENTION

Figure 1:
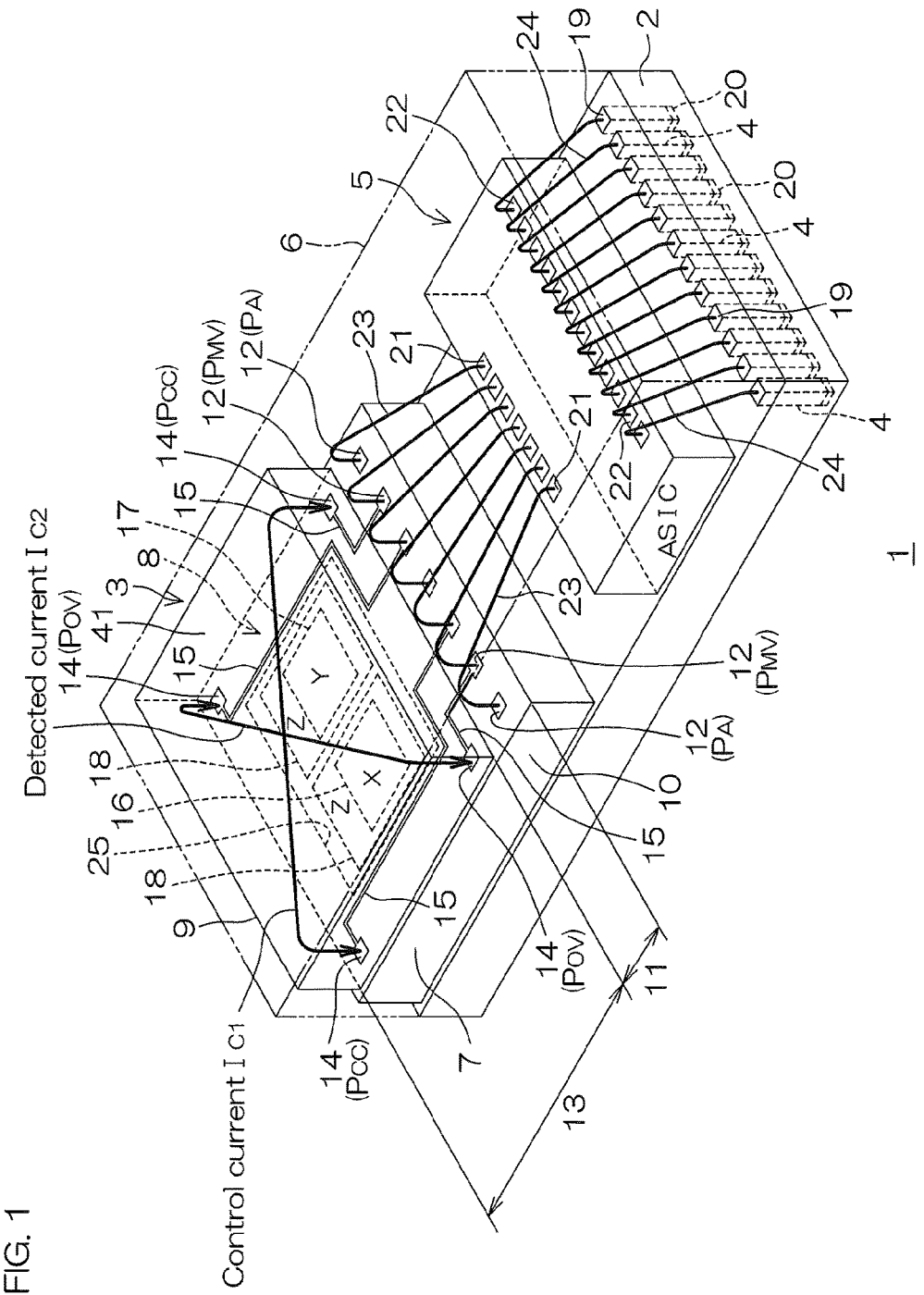
FIG. 1 is a schematic perspective view of a MEMS package according to a preferred embodiment of the present invention.

A preferred embodiment of the present invention provides a MEMS sensor that includes abase substrate including a displaceably supported movable portion and a lid substrate covering the movable portion and capable of functioning as a magnetic sensor that detects magnetism by making use of the Hall effect.

With this arrangement, the lid substrate can be used as a magnetic sensor and therefore, for example, inclination with respect to the Earth's axis can be detected by the movable portion and azimuth (north-south direction) can be detected by the lid substrate. A device that detects these two physical quantities can be realized in a single chip.

The base substrate may have a pair of first contact portions and a pair of second contact portions at an upper surface facing the lid substrate and the pair of first contact portions and the pair of second contact portions may be electrically connected to the lid substrate.

With this arrangement, a magnetic variation range detected by the lid substrate (magnetic sensor) can be determined by a layout of the pair of first contact portions and the pair of second contact portions.

The base substrate may have a plurality of first external pads disposed outside a region directly below the lid substrate and wirings lead out from the pair of first contact portions and the pair of second contact portions respectively to the plurality of first external pads.

With this arrangement, a current can easily be made to flow to the lid substrate (magnetic sensor) by performing wire bonding on the first external pads.

The base substrate may have a second external pad, electrically connected to the movable portion, in a pad region shared with the first external pads.

With this arrangement, the layout of the existing external pads can be used, thereby eliminating the need to make significant changes in a manufacturing process.

The lid substrate may have a rectangular plate shape, the pair of first contact portions may be disposed one by one directly below endpoints of one diagonal of the lid substrate, and the pair of second contact portions may be disposed one by one directly below end points of another diagonal of the lid substrate.

With this arrangement, a wide magnetic variation range can be defined for detection by the lid substrate (magnetic sensor).

The lid substrate may have a pair of first wire bonding portions and a pair of second wire bonding portions on a surface opposite a lower surface that faces the base substrate.

With this arrangement, the magnetic variation range detected by the lid substrate (magnetic sensor) can be determined by a layout of the pair of first wire bonding portions and the pair of second wire bonding portions.

The lid substrate may have a rectangular plate shape, the pair of first wire bonding portions may be disposed one by one at end points of one diagonal of the lid substrate, and the pair of second wire bonding portions may be disposed one by one at endpoints of another diagonal of the lid substrate.

With this arrangement, a wide magnetic variation range can be defined for detection by the lid substrate (magnetic sensor).

The lid substrate may be constituted of a low-resistance semiconductor substrate.

With this arrangement, a main body of the lid substrate itself can be defined to be the magnetic sensor.

The low-resistance semiconductor substrate may be constituted of silicon.

The lid substrate may have, within its area, a conductive film having a lower bandgap than silicon.

With this arrangement, the conductive film of the lid substrate can be defined to be the magnetic sensor. The conductive film can realize a lower electron mobility than silicon by its low bandgap and can thus improve the performance of the lid substrate as the magnetic sensor.

The MEMS sensor may further include an insulating film disposed between the conductive film and the lid substrate.

With this arrangement, a current input into the lid substrate can be made to flow with priority to the conductive film rather than the main body of the lid substrate. Consequently, an occupancy ratio of the conductive film in a current path of the magnetic sensor can be improved.

The insulating film may be constituted of silicon oxide.

The conductive film may be formed on the lower surface of the lid substrate that faces the base substrate.

The conductive film may be formed on the surface opposite the lower surface of the lid substrate that faces the base substrate.

The conductive film may have a thickness of 2000 Å to 10000 Å.

The conductive film may be constituted of a semiconductor film.

The semiconductor film may be constituted of germanium.

The semiconductor film may contain boron as an impurity.

The conductive film may be constituted of a metal film.

The metal film may be constituted of aluminum.

The base substrate may include a comb-teeth-shaped fixed electrode and a comb-teeth-shaped movable electrode as the movable portion combined with the fixed electrode.

A MEMS package of the present invention includes the MEMS sensor of the present invention and a resin package sealing the MEMS sensor.

With this arrangement, the MEMS sensor of the present invention that includes a magnetic sensor in a single chip is included to enable reduction of package size.

The MEMS package may include a circuit device that is electrically connected to the MEMS sensor and is sealed in the resin package shared with the MEMS sensor.

A preferred embodiment of the present invention provides a method for manufacturing a MEMS sensor including a step of forming a pair of first contact portions and a pair of second contact portions on a surface at one side of a base substrate that includes a displaceably supported movable portion, and a step of covering the movable portion with a lid substrate, capable of functioning as a magnetic sensor that detects magnetism by making use of the Hall effect, so as to be electrically connected to the pair of first contact portions and the pair of second contact portions.

The MEMS sensor can be manufactured by the present method.

The method for manufacturing a MEMS sensor may include a step of forming a conductive film, having a bandgap lower than silicon, on a surface at one side of the lid substrate, and the step of covering the movable portion may include a step of bonding the pair of first contact portions and the pair of second contact portions to the conductive film.

The step of forming the conductive film may include a step of forming a semiconductor film on the surface at one side of the lid substrate and thereafter implanting ions into the semiconductor film.

A preferred embodiment of the present invention provides a method for manufacturing a MEMS sensor including a step of forming a base substrate that includes a displaceably supported movable portion, a step of forming a conductive film, having a bandgap lower than silicon, on a surface at one side of a lid substrate capable of functioning as a magnetic sensor that detects magnetism by making use of the Hall effect, and a step of covering the movable portion with a surface of the lid substrate opposite the surface on which the conductive film is formed.

The step of forming the conductive film may include a step of forming a semiconductor film on the surface at one side of the lid substrate and thereafter implanting ions into the semiconductor film.

Preferred Embodiments of the Present Invention shall now be described in detail with reference to the attached drawings.

FIG. 1 is a schematic perspective view of a MEMS package 1 according to a preferred embodiment of the present invention.

The MEMS package 1 includes a substrate 2, an acceleration sensor 3 as an example of a MEMS sensor of the present invention, external terminals 4, an integrated circuit 5 (ASIC: Application Specific Integrated Circuit) as an example of a circuit device of the present invention, and a resin package 6.

The substrate 2 is formed to have a rectangular plate shape having a front surface and a back surface.

The acceleration sensor 3 is disposed at one longitudinal direction end portion at the front surface side of the substrate 2. The acceleration sensor 3 includes a device substrate 7 as an example of a base substrate of the present invention that is constituted of a silicon substrate, a sensor portion 8 provided in an inner region of the device substrate 7, and a lid substrate 9 that faces the device substrate 7 so as to cover the sensor portion 8.

The device substrate 7 has a lead-out portion 10 that is lead out to the outside of the lid substrate 9 and the lead-out portion 10 defines a pad region 11 of the device substrate 7. A plurality of electrode pads 12 are aligned at intervals in the pad region 11. In the present preferred embodiment, the device substrate 7 is formed to have a rectangular plate shape. The plurality of electrode pads 12 are aligned in a line along one side of the device substrate 7. The plurality of electrode pads 12 include a plurality of pads $P_A$ as an example of second external pads of the present invention that are used for acceleration detection, and a plurality of pads $P_{MV}$ as an example of first external pads of the present invention that are used for magnetic variation detection. The positioning of the pads $P_A$ and $P_{MV}$ is not restricted to the positions shown in FIG. 1 and may be determined as suited in consideration of the layout of other component parts of the acceleration sensor 3.

Also, the pads $P_A$ and $P_{MV}$ do not have to be provided in the pad region 11 in common. For example, a lead-out portion (pad region at the opposite side) may be provided at the opposite side of the lid substrate 9 with respect to the pad region 11 and the pads $P_{MV}$ may be provided selectively at the pad region at the opposite side. However, if the pads $P_A$ and $P_{MV}$ are disposed in the pad region 11 in common, the layout of an existing external pad can be used as it is, eliminating the need to make a significant change in a manufacturing process. Also, the circuit for acceleration detection and the circuit for magnetic variation detection can be consolidated at the integrated circuit 5 disposed at one side of the acceleration sensor 3.

Further on the device substrate 7, a plurality of electrode pads 14 and magnetic sensor side wirings 15, electrically connecting the plurality of electrode pads 14 and the plurality of pads $P_{MV}$, are formed in a region (facing region 13) facing the lid substrate 9.

The plurality of electrode pads 14 include a pair of pads $P_{CC}$ as an example of a pair of first contact portions of the present invention arranged to make a constant current flow to the lid substrate 9, and a pair of pads $P_{OV}$ as a pair of second contact portions of the present invention arranged to detect an output voltage from the lid substrate 9. In the present preferred embodiment, the lid substrate 9 has a rectangular plate shape. The pair of pads $P_{CC}$ are disposed one by one directly below end points of one diagonal of the lid substrate 9, and the pair of pads $P_{OV}$ are disposed one by one directly below end points of another diagonal of the lid substrate 9. That is, when viewed from the pad region 11, one each of the pad $P_{CC}$ and the pad $P_{OV}$ are disposed at a front side of the sensor portion 8 and one each of the pad $P_{CC}$ and the pad $P_{OV}$ are disposed at an opposite side of the sensor portion 8.

The magnetic sensor side wirings 15 extend across a boundary of the facing region 13 and the pad region 11 from the respective electrode pads 14 (pads $P_{CC}$ and $P_{OV}$) and are connected to respective electrode pads 12 (pads $P_{MV}$) in the pad region 11.

The sensor portion 8 has an X-axis sensor 16, a Y-axis sensor 17, and Z-axis sensors 18 as sensors respectively detecting accelerations around three orthogonal axes in three-dimensional space. The three types of sensors 16 to 18 are covered and sealed by the lid substrate 9.

A plurality (twelve in FIG. 1) of the external terminals 4 are provided at intervals along a width direction of the substrate 2 at the other longitudinal direction end portion (end portion at the side opposite the acceleration sensor 3) of the substrate 2. Each external terminal 4 is formed to penetrate through the substrate 2 in the thickness direction and is exposed as an internal pad 19 at the front surface of the substrate 2 and as an external pad 20 at the back surface of the substrate 2.

The integrated circuit 5 is disposed at the front surface side of the substrate 2 and between the acceleration sensor 3 and the external terminals 4 (internal pads 19). The integrated circuit 5 is constituted, for example, of a silicon substrate with an oblong plate shape that is long in the width direction of the substrate 2. In the interior of the silicon substrate are formed charge amps that amplify electrical signals output from the respective sensors 16 to 18 and the lid substrate 9, filter circuits (low-pass filters: LPFs, etc.) that take out specific frequency components of the electrical signals, logic circuits that perform logic operations on the electrical signals after filtering, etc. These circuits are constituted, for example, of CMOS devices. The integrated circuit 5 also has electrode pads 21 and electrode pads 22.

A plurality (seven in FIG. 1) of the electrode pads 21 are provided at intervals along the width direction of the substrate 2 at an end portion at a side close to the acceleration sensor 3 in the longitudinal direction of the substrate 2. The electrode pads 21 are connected one-on-one to the electrode pads 12 of the acceleration sensor 3 by bonding wires 23.

A plurality (twelve in FIG. 1) of the electrode pads 22 are provided at intervals along the width direction of the substrate 2 at an end portion at a side close to the external terminals 4 in the longitudinal direction of the substrate 2. The electrode pads 22 are connected one-on-one to the internal pads 19 of the external terminal 4 by bonding wires 24.

The resin package 6, together with the substrate 2, defines the outer shape of the MEMS package 1 and is formed to a substantially rectangular parallelepiped shape. The resin package 6 is constituted, for example, of a known molding resin, such as epoxy resin, etc., and seals the acceleration sensor 3 and the integrated circuit 5 so as to cover the bonding wires 23 and 24 and the internal pads 19 together with the acceleration sensor 3 and the integrated circuit 5 and expose the external pads 20.

The internal structure of the acceleration sensor 3 shall now be described specifically with reference to FIG. 1 to FIG. 3.

Figure 2:
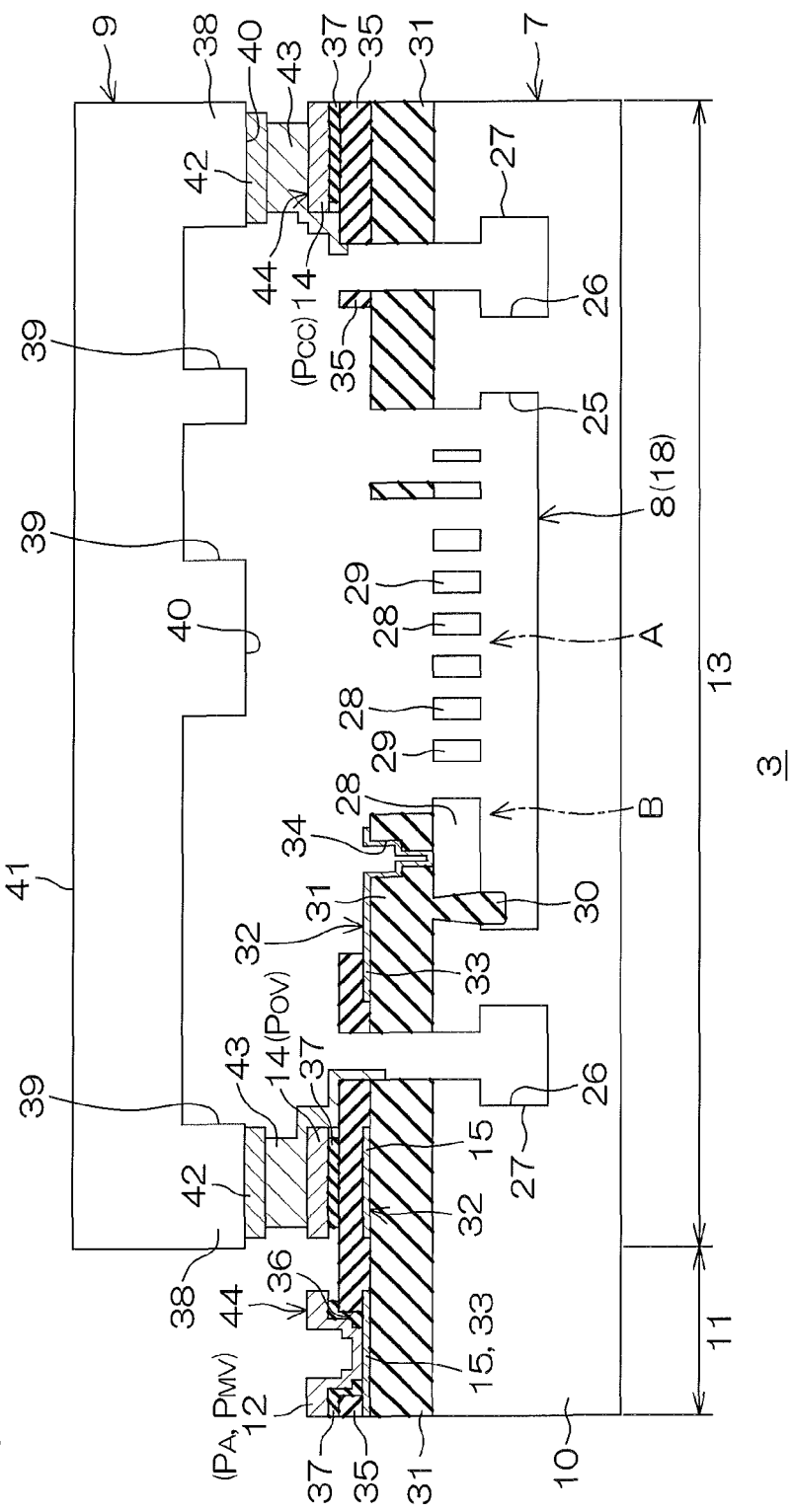
FIG. 2 is a schematic sectional view of an acceleration sensor of FIG. 1.
Figure 3:
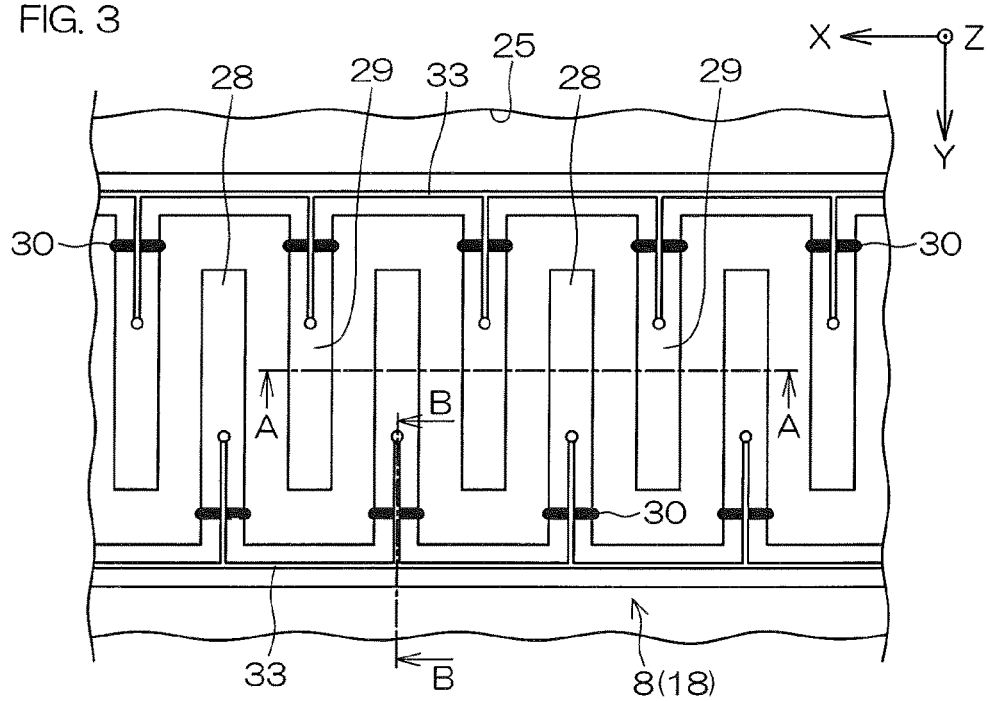
FIG. 3 is an enlarged plan view for describing the structure of a sensor portion of the acceleration sensor of FIG. 2.

FIG. 2 is a schematic sectional view of the acceleration sensor 3 of FIG. 1. FIG. 3 is an enlarged plan view for describing the structure of the sensor portion 8 (Z-axis sensors 18) of the acceleration sensor 3 of FIG. 2. It shall be noted that FIG. 2 illustrates the cross-sectional structure of a characteristic portion of the acceleration sensor 3 fragmentarily and does not illustrate a cross section that appears when the acceleration sensor 3 is sectioned along a specific section line. For example, a portion indicated by an alternate long and short dash line arrow A in FIG. 2 is a cross section corresponding to a section line A-A in FIG. 3, and a portion indicated by an alternate long and short dash line arrow B in FIG. 2 is a cross section corresponding to a section line B-B in FIG. 3.

In a front surface portion of the device substrate 7 of the acceleration sensor 3, a recess 25 and a trench 26 are formed in a mutually spaced manner. As shown in FIG. 1, the recess 25 is formed at a substantially central region of the device substrate 7 so as to contain the three sensors 16 to 18 in its interior. Although not illustrated, the trench 26 is formed to an annular shape that surrounds the recess 25 at a more central portion of the device substrate 7 than the four electrode pads 14. To compare the depth of the two cavity portions, the trench 26 is formed deeper than the recess 25. Also, the trench 26 has a wide portion 27 selectively at its lower portion. The wide portion 27 is formed by side surfaces of the lower portion of the trench 26 being set back both inward and outward with respect to side surfaces of an upper portion.

The sensor portion 8 (X-axis sensor 16, Y-axis sensor 17, and Z-axis sensors 18) are provided in the interior of the recess 25 in a state of being floated from a bottom surface of the recess 25.

The structure of a Z-axis sensor 18 shall now be described specifically with reference to FIG. 2 and FIG. 3.

The Z-axis sensor 18 includes a comb-teeth-shaped fixed electrode 28 and a comb-teeth-shaped movable electrode 29, as an example of a movable portion of the present invention combined with the fixed electrode 28, and the electrodes are each constituted of a portion of the device substrate 7. Whereas the fixed electrode 28 is fixed to a main body portion of the device substrate 7, the movable electrode 29 is supported by the main body portion of the device substrate 7 via a spring mechanism, etc., formed using a portion of the device substrate 7. When an acceleration is applied to the Z-axis sensor 18, the spring mechanism connected to the movable electrode 29 expands and contracts. A movement distance of the spring mechanism in this process is detected as a change of electrostatic capacitance between the fixed electrode 28 and the movable electrode 29 and is taken out from an electrode pad 12 (pad $P_A$) as an electrical signal corresponding to the acceleration.

An embedded insulating film 30 is embedded in a base end portion of each tooth of the fixed electrode 28 and the movable electrode 29. The embedded insulating film 30 is formed to reach from a front surface to a back surface of each tooth of the fixed electrode 28 and the movable electrode 29 and to further project into the recess 25 in the present preferred embodiment. Each tooth of the fixed electrode 28 and the movable electrode 29 is made electrically independent by the embedded insulating film 30.

Although not illustrated, the sensor structure arranged by the fixed electrode 28, the movable electrode 29, and the embedded insulating film 30 is also applied to the X-axis sensor 16 and the Y-axis sensor 17 (description omitted).

A first insulating film 31 is formed on the device substrate 7. The first insulating film 31 is constituted, for example, of silicon oxide. The first insulating film 31 is selectively removed from a region of a portion of the fixed electrode 28 and the movable electrode 29 and a region above the trench 26. Specifically, the removal region includes a region at tip sides of contact positions of acceleration sensor side wirings 33 (to be described later) at the respective electrodes 28 and 29.

A first wiring film 32 is formed on the first insulating film 31. The first wiring film 32 is constituted, for example, of aluminum. The first wiring film 32 includes the magnetic sensor side wirings 15 and the acceleration sensor side wirings 33. As with the magnetic sensor side wirings 15, the acceleration sensor side wirings 33 extend across the boundary of the facing region 13 and the pad region 11. In the facing region 13, the acceleration sensor side wirings 33 are connected to the respective teeth of the fixed electrode 28 and the movable electrode 29 via contact holes 34 formed in the first insulating film 31.

A second insulating film 35 is formed on the first insulating film 31 so as to cover the first wiring film 32. The second insulating film 35 is constituted, for example, of silicon oxide. In the pad region 11, contact holes 36 exposing a portion of each of the magnetic sensor side wirings 15 and acceleration sensor side wirings 33 are formed in the second insulating film 35.

A third insulating film 37 is formed on the second insulating film 35. The third insulating film 37 is constituted, for example, of silicon oxide. The third insulating film 37 is formed selectively on regions of the second insulating film 35 directly below the electrode pads 12 and 14. In the contact holes 36 directly below the electrode pads 12, the third insulating film 37 is formed selectively on side surfaces of the contact holes 36 so as to expose the magnetic sensor side wirings 15 and acceleration sensor side wirings 33. Layer of insulating films directly below the electrode pads 12 and 14, to which the bonding wires 23 and bonding material 43 (described later) are bonded, are selectively thickened by the third insulating film 37.

A second wiring film 44 that includes the electrode pads 12 and the electrode pads 14 is formed on the third insulating film 37. The second wiring film 44 is constituted, for example, of aluminum (Al—Cu based alloy, etc.). The electrode pads 12 are connected to the magnetic sensor side wirings 15 and acceleration sensor side wirings 33 via the contact holes 36.

The lid substrate 9 of the acceleration sensor 3 is constituted, for example, of a low-resistance silicon substrate with a resistance of 0.002 Ω·cm to 0.025 Ω·cm. Although another type of semiconductor substrate, such as a silicon carbide (SiC) substrate, a gallium nitride (GaN) substrate, etc., may be used as the lid substrate 9, it is preferable to use a silicon substrate that is inexpensive.

The lid substrate 9 has an annular peripheral rim 38 along its outer periphery. In the present preferred embodiment, the peripheral rim 38 is formed to a rectangular annular shape along sides of a rectangle having the locations at which the four electrode pads 14 (pads $P_{CC}$ and $P_{OV}$) are formed as corner portions.

A plurality of recesses 39 are formed selectively in a region inward of the peripheral rim 38. The recesses 39 are portions formed by selectively digging in from a lower surface 40 of the lid substrate 9 that faces the device substrate 7. On the other hand, a flat semiconductor surface (silicon surface) is exposed at a surface (upper surface 41) opposite the lower surface 40 of the lid substrate 9. The positions and shapes of the recesses 39 are not restricted to those shown in FIG. 2 and may be determined as suited in consideration of the shape of the sensor portion 8. A bonding pad 42 is formed on the lower surface 40 at the peripheral rim 38. The bonding pad 42 is formed across the entire periphery of the peripheral rim 38.

The bonding material 43 that bonds the device substrate 7 and the lid substrate 9 is formed in an annular shape along the peripheral rim 38. The bonding material 43 is constituted, for example, of glass frit that contains conductive particles. The bonding material 43 adheres closely to the electrode pads 14 at locations at which the electrode pads 14 are disposed and adheres closely to an insulating film surface at regions at which an electrode pad 14 is not disposed and an insulating film (second insulating film 35) is exposed (only the former mode of close adhesion is illustrated in FIG. 2). A gap between the device substrate 7 and the lid substrate 9 is filled by the bonding material 43 to achieve sealing of the sensor portion 8. Also, the device substrate 7 is electrically connected to the lid substrate 9 at the four locations at which the electrode pads 14 are disposed. A portion of the bonding material 43 may droop into the trench 26 as shown in FIG. 2.

Figure 4:
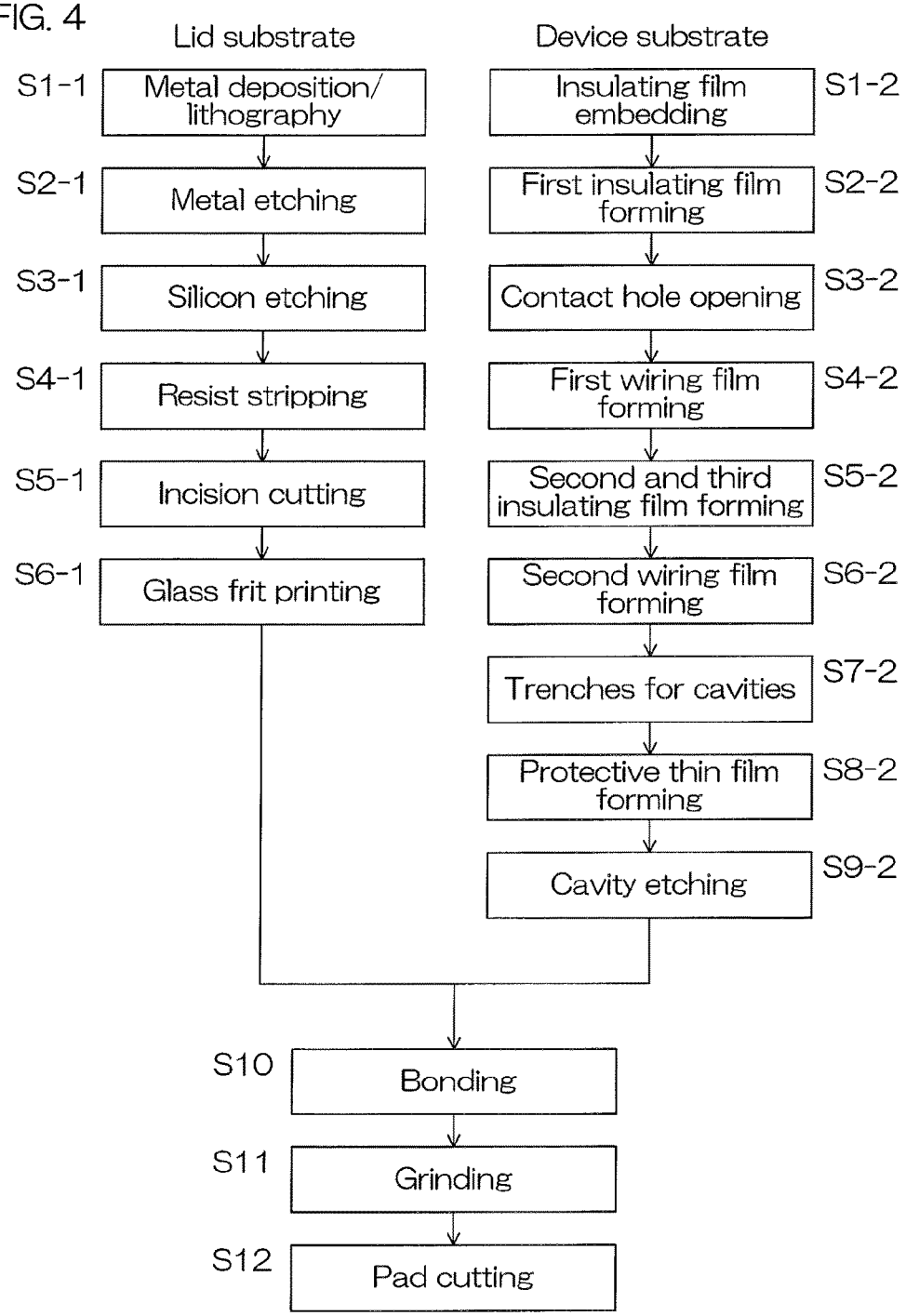
FIG. 4 is a flow diagram of an example of a process for manufacturing the acceleration sensor of FIG. 2.

FIG. 4 is a flow diagram of an example of a process for manufacturing the acceleration sensor 3 of FIG. 2. FIG. 5A to FIG. 5I are diagrams illustrating portions of the process for manufacturing the acceleration sensor 3 of FIG. 2 in the order of steps. In regard to the sensor portion 8, only the process for manufacturing a Z-axis sensor 18 is illustrated in this section and the processes for manufacturing the X-axis sensor 16 and the Y-axis sensor 17 are omitted. The processes for manufacturing the X-axis sensor 16 and the Y-axis sensor 17 are the same as the process for manufacturing the Z-axis sensor 18 and are executed in parallel to the process for manufacturing the Z-axis sensor 18.

To manufacture the acceleration sensor 3, a metal film 45 is deposited on the lower surface 40 of the lid substrate 9, for example, by a sputtering method, and thereafter a resist film 46 is formed selectively on the metal film 45 as shown in FIG. 5A (S1-1).

Thereafter, as shown in FIG. 5B, the metal film 45 is patterned by etching via the resist film 46 (S2-1). The bonding pad 42 is thereby formed. Thereafter, the resist film 46 is stripped.

Thereafter as shown in FIG. 5C, a resist film 47 is formed selectively on the lower surface 40 of the lid substrate 9. By etching via the resist film 47, the plurality of recesses 39 are formed in the lid substrate 9 and the peripheral rim 38 is formed at the same time (S3-1).

Figure 5D:
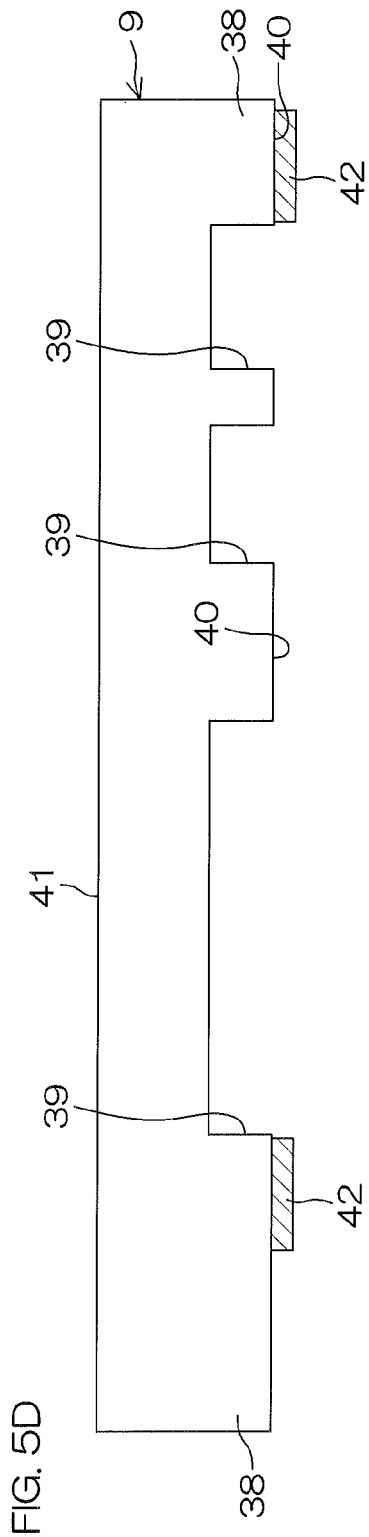

Thereafter as shown in FIG. 5D, the resist film 47 is stripped (S4-1).

Thereafter as shown in FIG. 5E, an incision 48 is formed in a portion of the peripheral rim 38 of the lid substrate 9 by selective etching (S5-1). The incision 48 is a trench that serves as a marker when exposing the pad region 11 by cutting off a peripheral edge portion of the lid substrate 9 in a subsequent step.

Thereafter as shown in FIG. 5F, the bonding material 43 is printed onto the peripheral rim 38 of the lid substrate (S6-1). Preparation of the lid substrate 9 is thereby completed.

Also, the sensor portion 8 is formed at the device substrate 7 either before or after or in parallel to the steps shown in FIG. 5A to FIG. 5F.

Figure 5G:
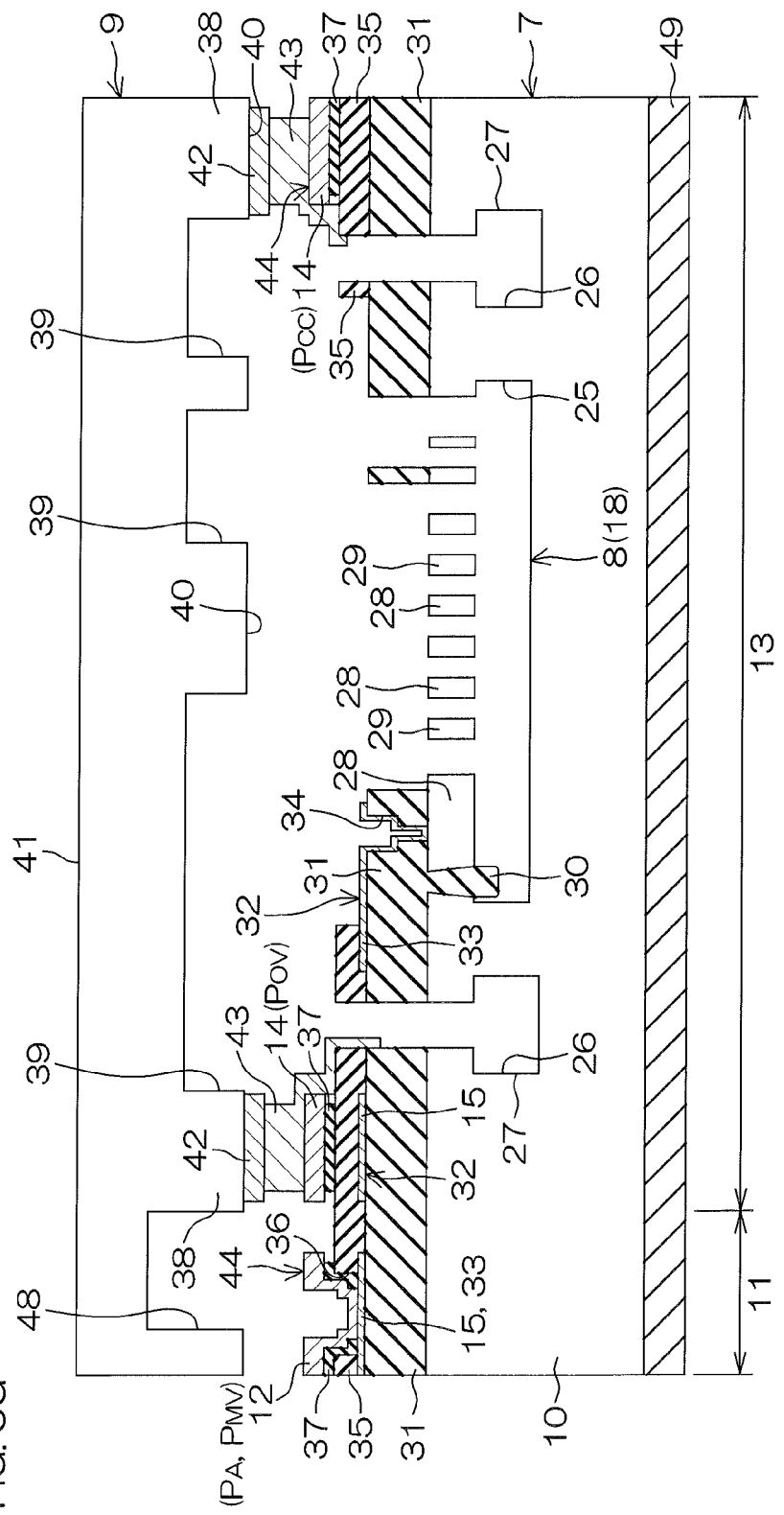

Specifically, first, as shown in FIG. 5G, the device substrate 7, with an insulating film 49 formed on its back surface, is prepared, deep trenches are formed by selectively etching the device substrate 7, and the embedded insulating film 30 is formed by embedding an insulating material in the deep trenches (S1-2). Thereafter, the first insulating film 31 is formed on the device substrate 7 and the contact holes 34 are formed in the first insulating film 31 (S2-2, S3-2). Thereafter, the first wiring film 32 (the magnetic sensor side wirings 15 and the acceleration sensor side wirings 33) is formed selectively on the first insulating film 31 (S4-2). Thereafter, the second insulating film 35 and the third insulating film 37 are formed successively, and then the second wiring film 44 (the electrode pads 12 and the electrode pads 14) is formed (S5-2, S6-2). Thereafter, the first insulating film 31, the second insulating film 35, and the third insulating film 37 on regions in which the recess 25 and the trench 26 of the device substrate 7 are to be formed are removed selectively and then a plurality of trenches are formed inside the forming regions of the recess 25 and the trench 26 by anisotropic deep RIE (S7-2). These trenches ultimately become the gap portions between the comb-teeth-shaped fixed electrode 28 and the movable electrode 29. Thereafter, a protective thin film, constituted of silicon oxide, is formed on the inner surfaces of the trenches and then portions of the protective thin film at bottom portions of the trenches are removed selectively by etching back (S8-2). Thereafter, the trenches are dug in further by anisotropic deep RIE and then isotropic RIE is performed (S9-2). The etching is thereby made to progress in the lateral direction and all mutually adjacent trenches are integrated together below the fixed electrode 28 and the movable electrode 29. The recess 25 is thereby formed in the interior of the device substrate 7, and the fixed electrode 28 and the movable electrode 29 are put in a floated stated in the recess 25. Projecting portions of the embedded insulating film 30 and the wide portion 27 of the trench 26 are formed by the etching that progresses in the lateral direction. The preparation of the device substrate 7 is completed through the above steps.

When the preparation of the lid substrate 9 (S1-1 to S6-1) and the preparation of the device substrate 7 (S1-2 to S9-2) are ended, a step of bonding the two follows. First, as shown in FIG. 5G, the lid substrate 9 is positioned with respect to the device substrate 7 and then the lid substrate 9 is pressed against it. The entirety of the bonding material 43 is thereby made to adhere closely to the device substrate 7 and the two are bonded (S10).

Figure 5H:
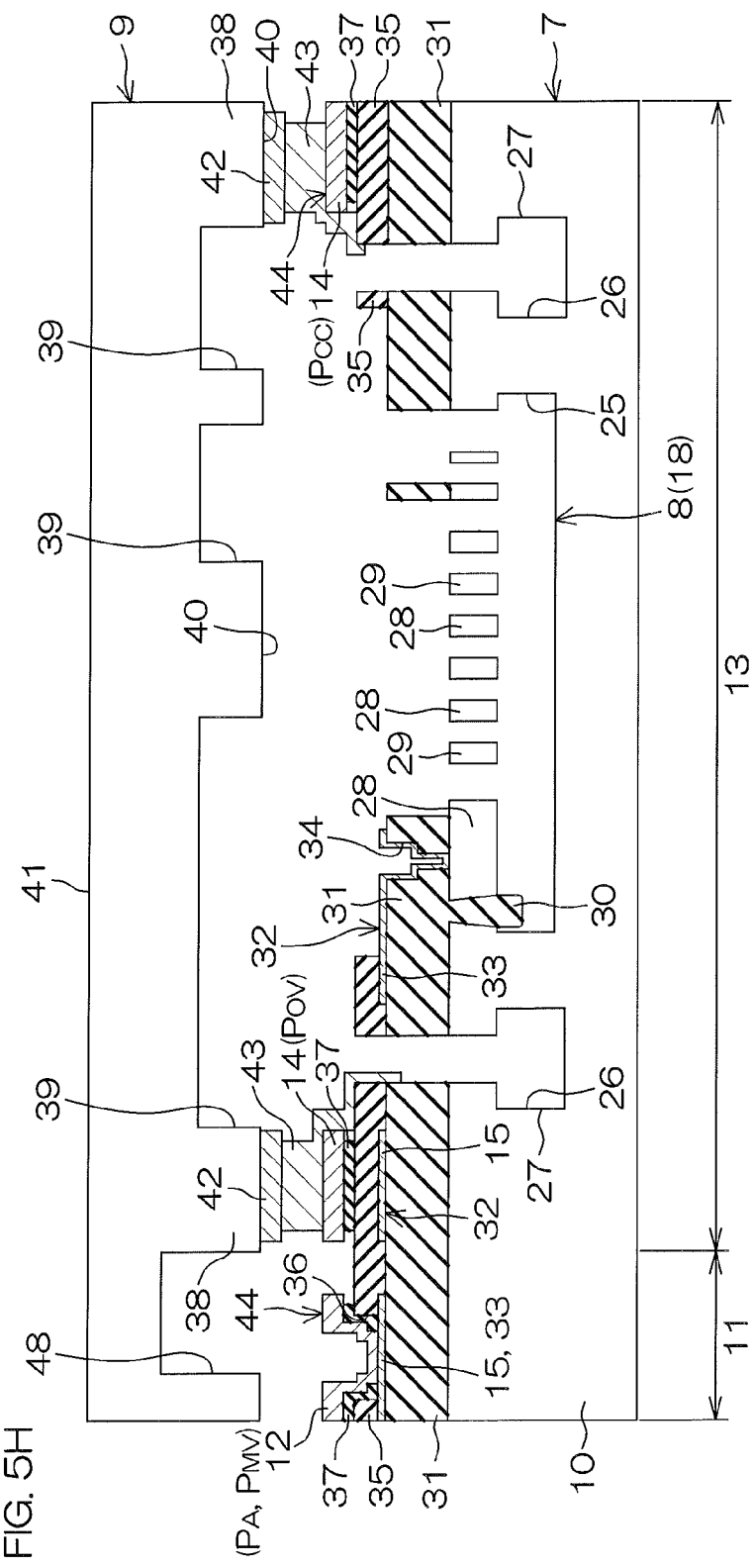

Thereafter, as shown in FIG. 5H, the device substrate 7 is ground from the back surface to completely remove the insulating film 49 and perform thinning (S11).

Figure 5I:
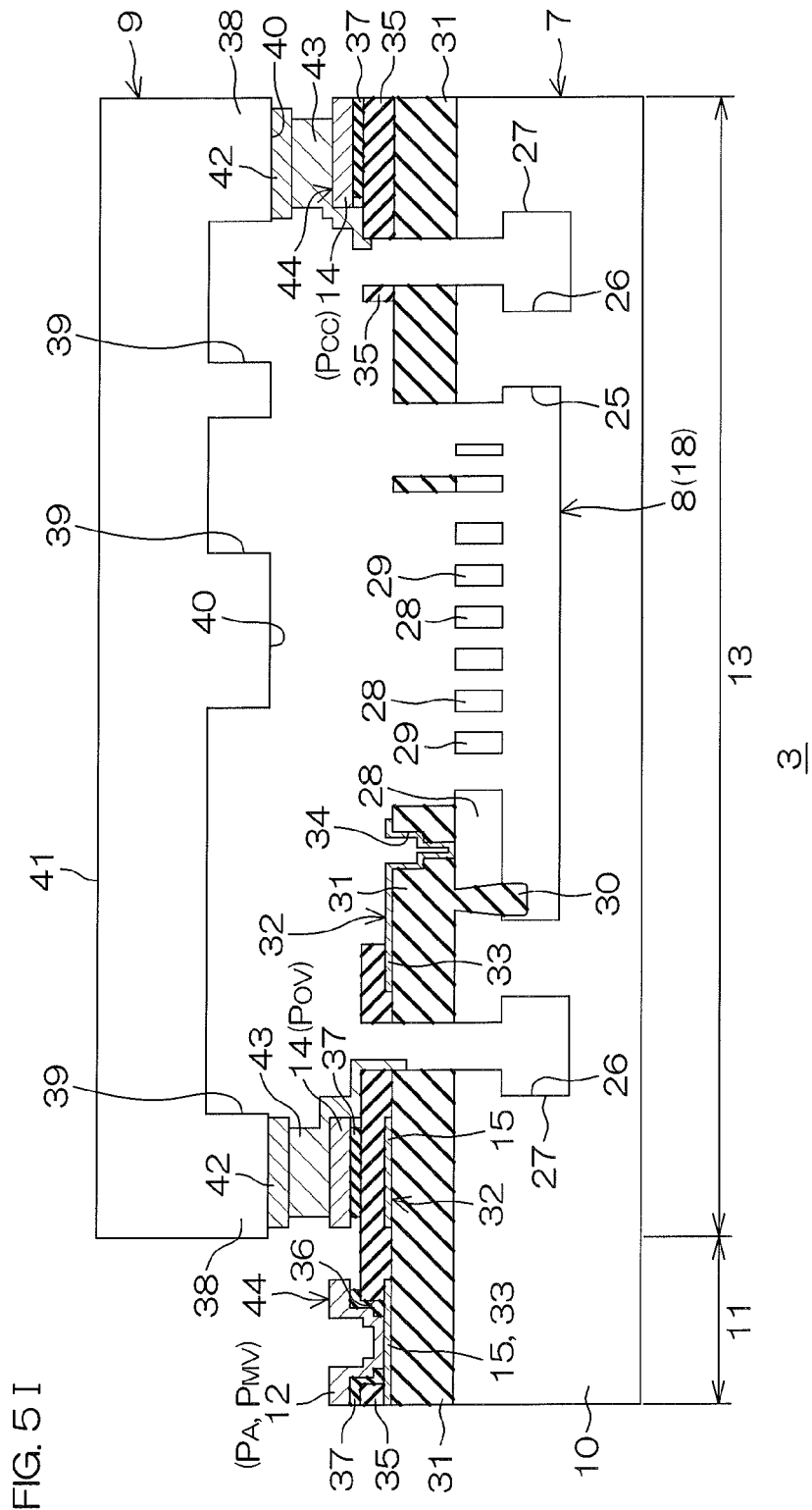

Thereafter, as shown in FIG. 5I, unnecessary portions (outer side portions of the incision 48) of the lid substrate 9 are cut off selectively to expose the pad region 11 of the device substrate 7 (S12).

The acceleration sensor 3 of FIG. 2 is obtained through the above steps.

Figure 6:
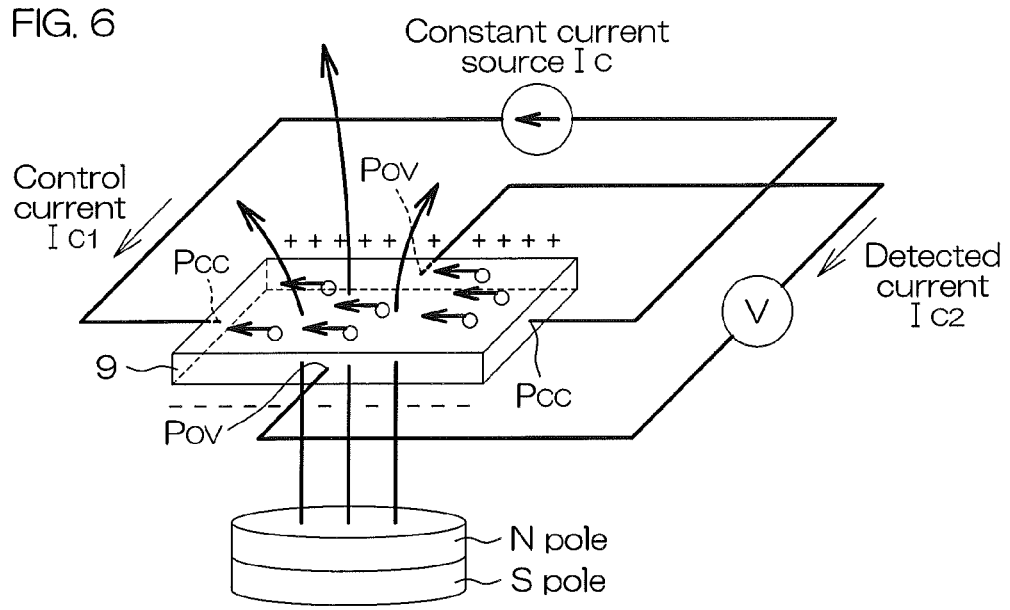
FIG. 6 is a diagram for describing operation principles of a magnetic sensor (lid substrate) of FIG. 2.

With the acceleration sensor 3, the total of four pads $P_{CC}$ and $P_{OV}$, constituted of the pair of pads $P_{CC}$ and the pair of pads $P_{OV}$, are connected to the lid substrate 9 that is constituted of the low-resistance silicon substrate. By this arrangement, when a control current (constant current) $I_{C1}$ is made to flow between the pair of pads $P_{CC}$, the lid substrate 9 detects a variation of magnetic field in the thickness direction of the lid substrate 9 as a detected current $I_{C2}$ based on the Hall effect as shown in FIG. 1 and FIG. 6. That is, the lid substrate 9 can be made to function as a Hall element type magnetic sensor. Therefore, inclination of the acceleration sensor 3 with respect to the Earth's axis can be detected by the X-axis sensor 16, the Y-axis sensor 17, and the Z-axis sensors 18 and azimuth (north-south direction) can be detected by the lid substrate 9. A device that can detect the two physical quantities can be realized in a single chip. A highly functional physical quantity sensor having the functions of at least an acceleration sensor and a magnetic sensor in combination can thus be provided.

Moreover, the pair of pads $P_{CC}$ are disposed one by one directly below the end points of one diagonal of the lid substrate 9, and the pair of pads $P_{OV}$ are disposed one by one directly below the endpoints of the other diagonal of the lid substrate 9. Therefore, space within the area of the rectangular lid substrate 9 can be put to maximum use to define a wide magnetic variation range for detection by the lid substrate 9 (magnetic sensor). Also, the detection range can be adjusted easily by changing the layout of the pair of pads $P_{CC}$ and the pair of pads $P_{OV}$.

Figure 7:
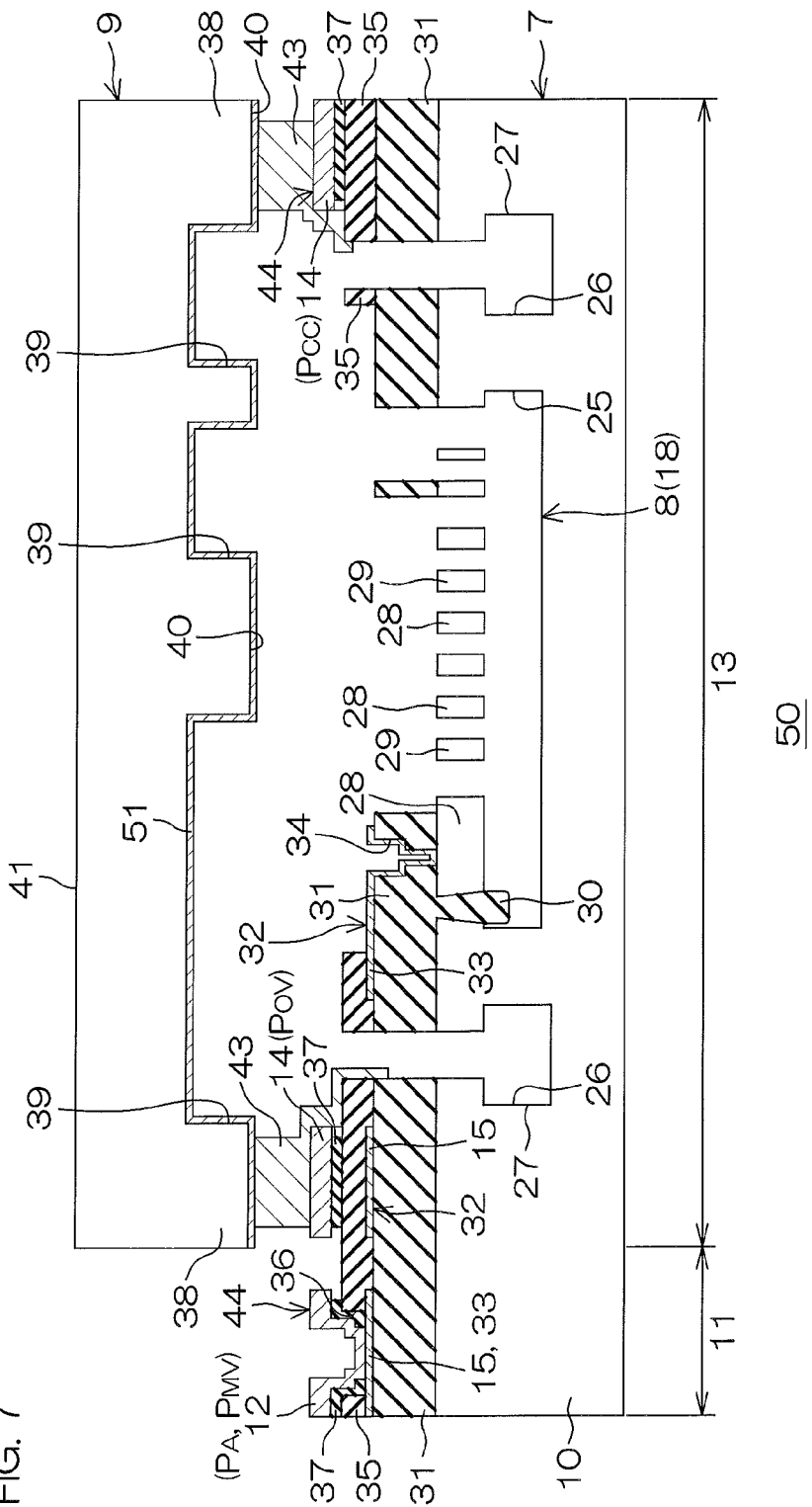
FIG. 7 is a schematic view of another example of the acceleration sensor of FIG. 1.

FIG. 7 is a schematic view of another example (acceleration sensor 50) of the acceleration sensor 3 of FIG. 1. In FIG. 7, elements mutually corresponding to those in FIG. 2 are shown with the same reference symbols being attached.

With the acceleration sensor 50, the bonding pad 42 is omitted and a semiconductor film 51 is formed instead on the lower surface 40 of the lid substrate 9. With the semiconductor film 51, a surface at one side and a surface at another side thereof are formed to run parallel to a top surface of the peripheral rim 38 and inner surfaces of the recesses 39. The semiconductor film 51 has a thickness of, for example, 2000 Å to 10000 Å. Also, although the semiconductor film 51 is constituted of germanium in the present preferred embodiment, it may be constituted of another semiconductor, preferably a semiconductor with a lower bandgap than silicon. As a matter of course, for example, a metal film of aluminum, etc., may be used as long as it has a bandgap lower than silicon.

The bonding material 43 is formed on the semiconductor film 51. Therefore, with the acceleration sensor 50, electrical connection with the lid substrate 9 is achieved at the semiconductor film 51. That is, with the acceleration sensor 50, the total of four pads $P_{CC}$ and $P_{OV}$, constituted of the pair of pads $P_{CC}$ and the pair of pads $P_{OV}$, are connected to the semiconductor film 51 of the lid substrate 9. The semiconductor film 51 can thereby be made to function as a Hall element type magnetic sensor. The semiconductor film 51 enables realization of a lower electron mobility than silicon by the low bandgap and can thus improve the performance of the lid substrate 9 as a magnetic sensor.

Figure 8:
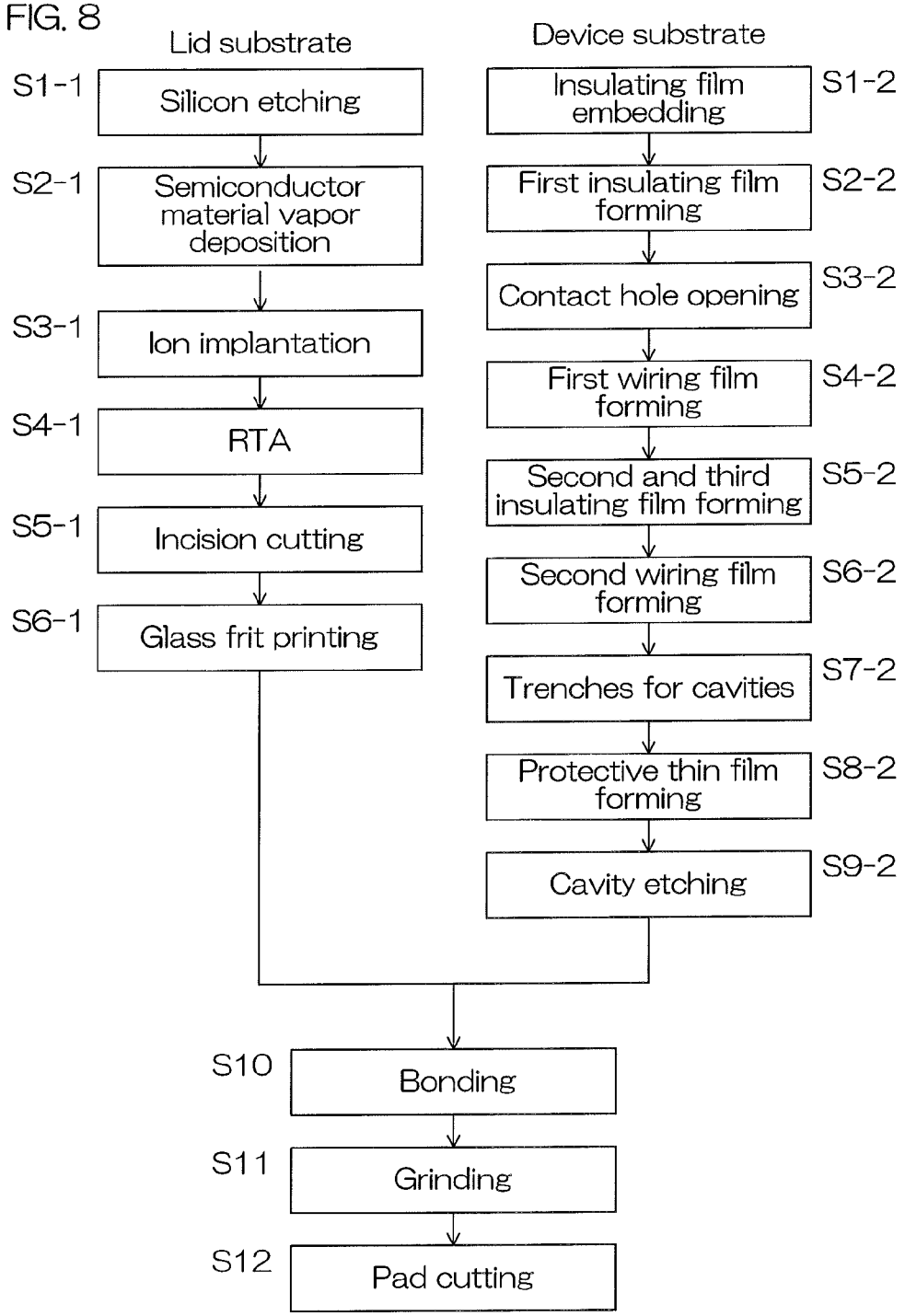
FIG. 8 is a flow diagram of an example of a process for manufacturing the acceleration sensor of FIG. 7.

FIG. 8 is a flow diagram of an example of a process for manufacturing the acceleration sensor 50 of FIG. 7. FIG. 9A to FIG. 9I are diagrams illustrating portions of the process for manufacturing the acceleration sensor 50 of FIG. 7 in the order of steps. In FIG. 9A to FIG. 9I, elements mutually corresponding to those in FIG. 5A to FIG. 5I are shown with the same reference symbols being attached.

To manufacture the acceleration sensor 50, the resist film 47 is formed selectively on the lower surface 40 of the lid substrate 9 as shown in FIG. 9A. By etching via the resist film 47, the plurality of recesses 39 are formed in the lid substrate 9 and the peripheral rim 38 is formed at the same time (S1-1).

Figure 9B:
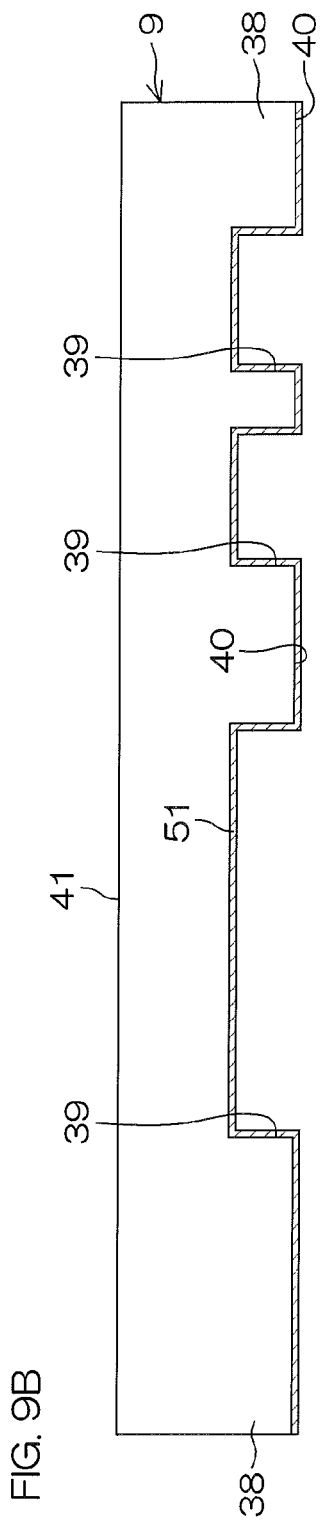

Thereafter as shown in FIG. 9B, the semiconductor film 51 is deposited on the entirety of the lower surface 40 of the lid substrate 9 by a vapor deposition method (S2-1).

Figure 9C:
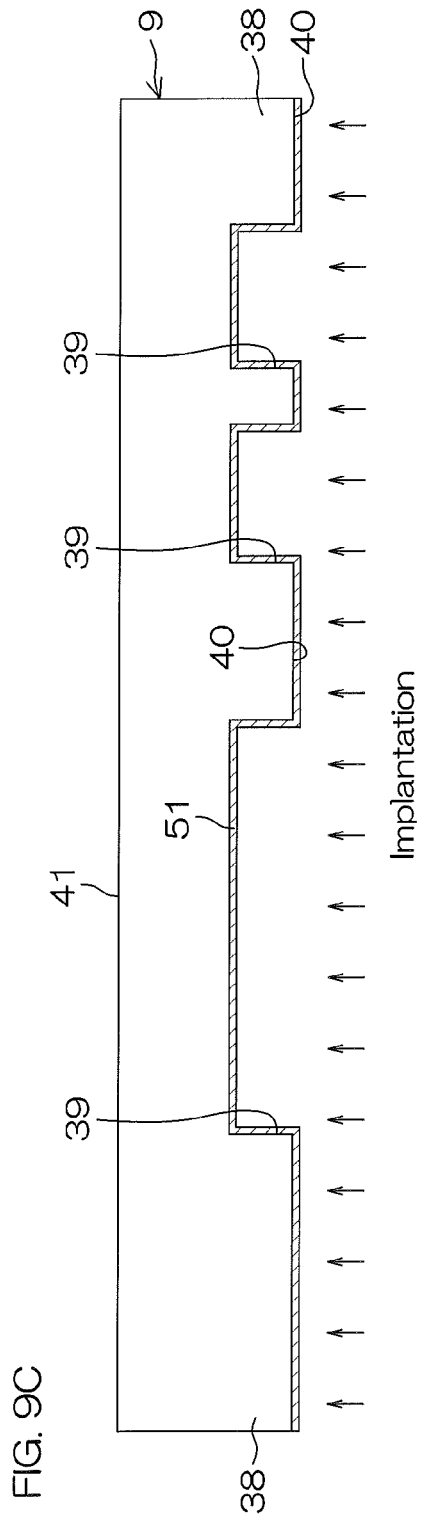

Thereafter as shown in FIG. 9C, impurity ions (boron, in the present preferred embodiment) are implanted into the semiconductor film 51 (S3-1).

Thereafter as shown in FIG. 9D, the semiconductor film 51 is heat treated by RTA (Rapid Thermal Annealing) (S4-1). The impurity inside the semiconductor film 51 is thereby activated.

Thereafter as shown in FIG. 9E, the incision 48 is formed in a portion of the peripheral rim 38 of the lid substrate 9 by selective etching (S5-1).

Figure 9F:
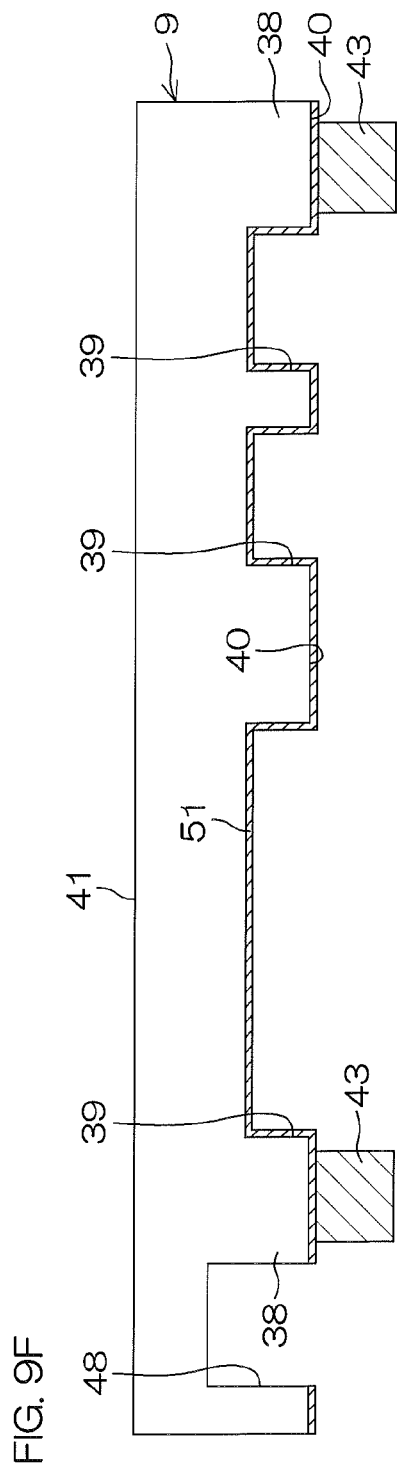

Thereafter as shown in FIG. 9F, the bonding material 43 is printed onto the peripheral rim 38 of the lid substrate 9 (S6-1). Preparation of the lid substrate 9 is thereby completed.

Also, the sensor portion 8 is formed at the device substrate 7 either before or after or in parallel to the steps shown in FIG. 9A to FIG. 9F (S1-2 to S9-2). The preparation of the device substrate 7 is thereby completed.

Figure 9G:
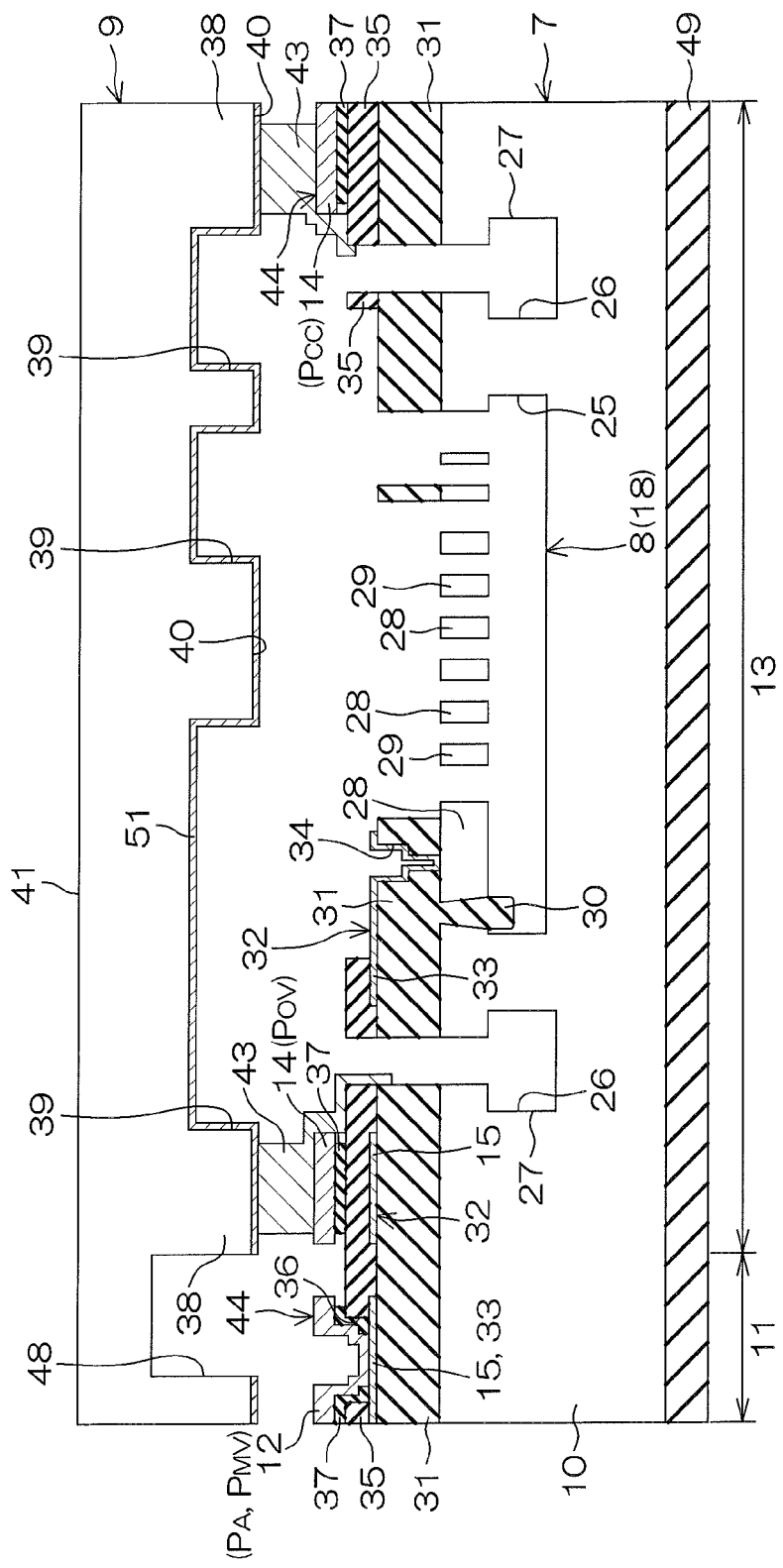

When the preparation of the lid substrate 9 (S1-1 to S6-1) and the preparation of the device substrate 7 (S1-2 to S9-2) are ended, a step of bonding the two follows. First, as shown in FIG. 9G, the lid substrate 9 is positioned with respect to the device substrate 7 and then the lid substrate 9 is pressed against it. The entirety of the bonding material 43 is thereby made to adhere closely to the device substrate 7 and the two are bonded (S10).

Figure 9H:
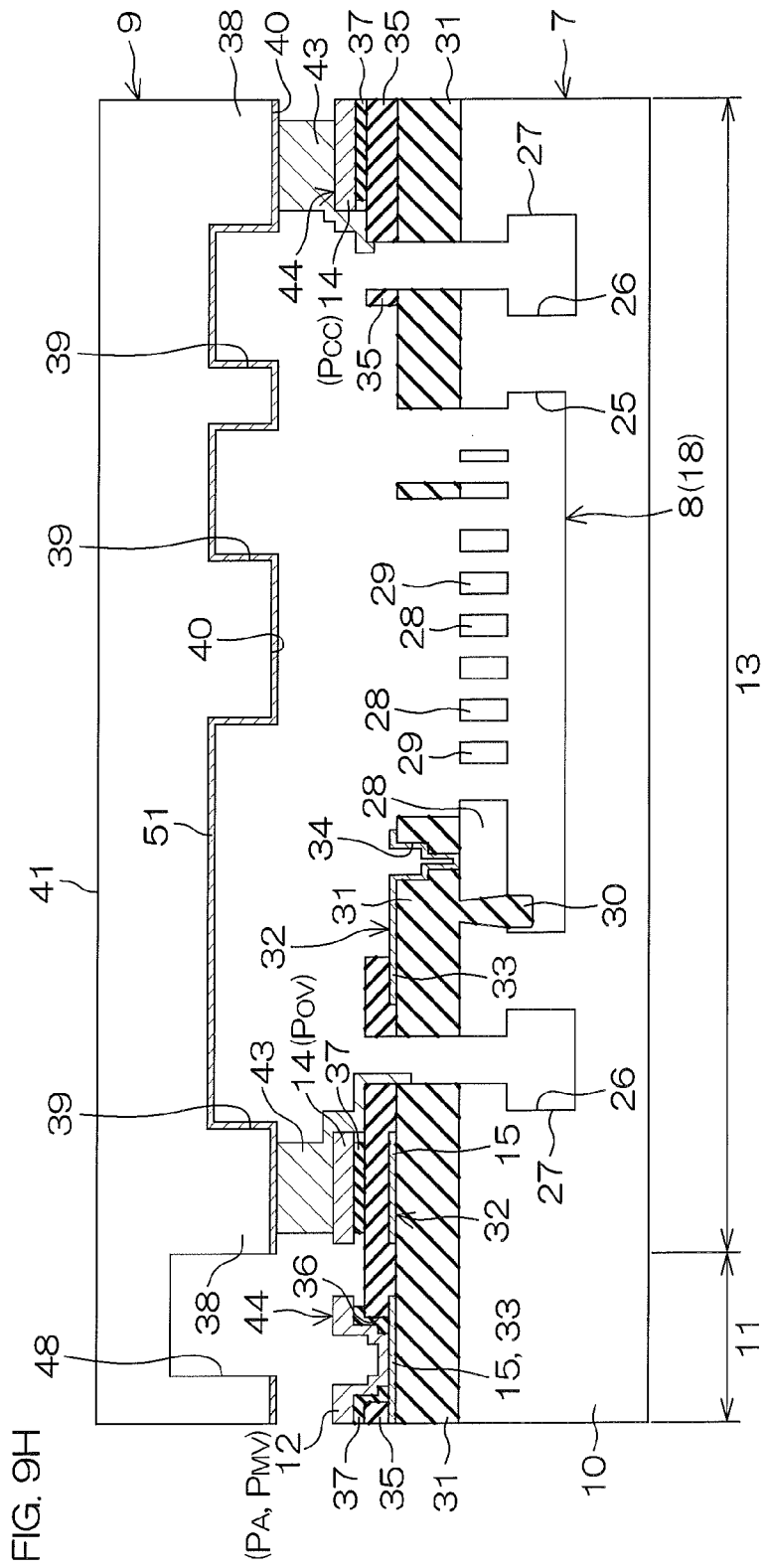

Thereafter, as shown in FIG. 9H, the device substrate 7 is ground from the back surface to completely remove the insulating film 49 and perform thinning (S11).

Figure 9I:
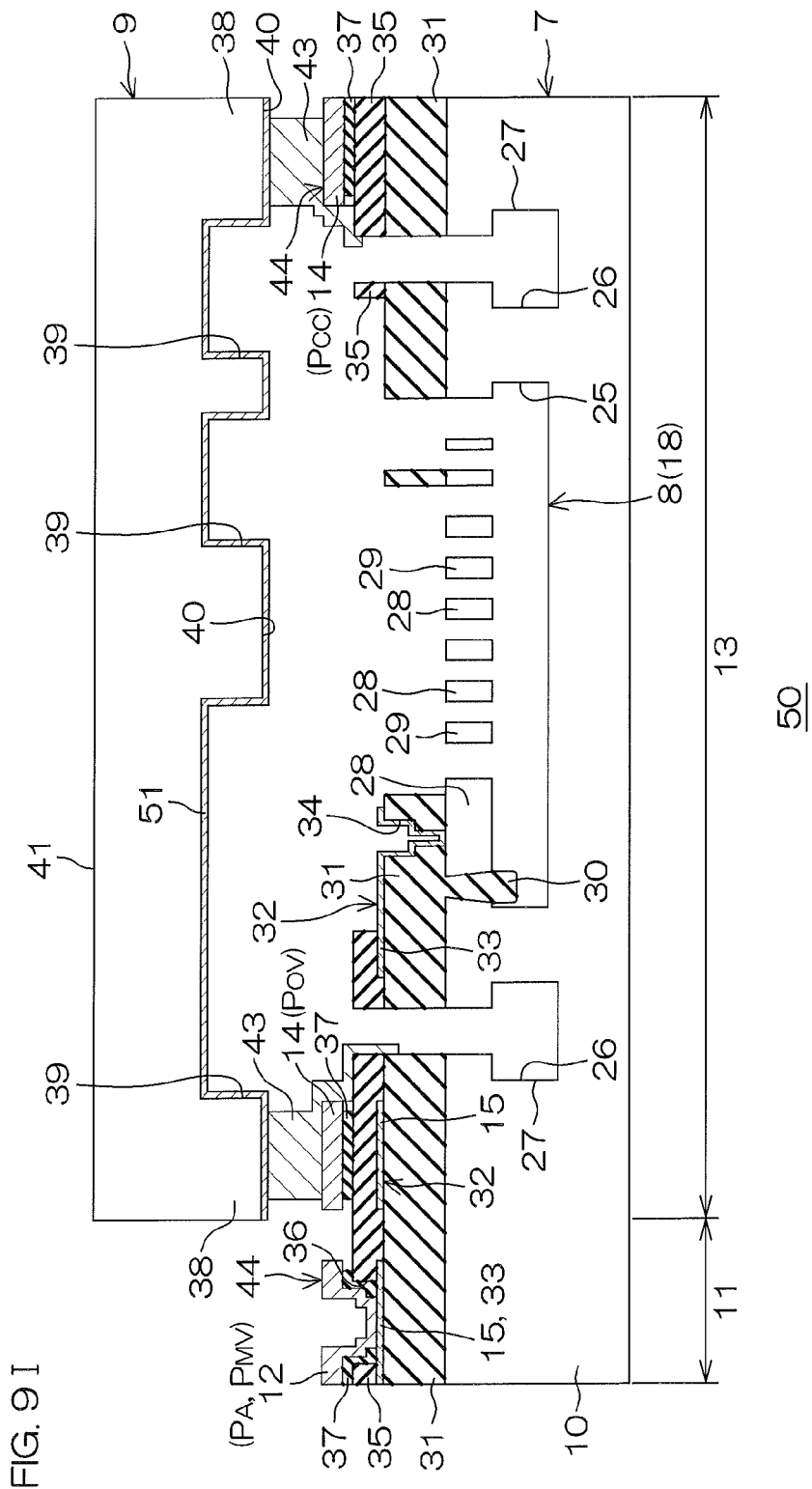

Thereafter, as shown in FIG. 9I, unnecessary portions (outer side portions of the incision 48) of the lid substrate 9 are cut off selectively to expose the pad region 11 of the device substrate 7 (S12).

The acceleration sensor 50 of FIG. 7 is obtained through the above steps.

Figure 10:
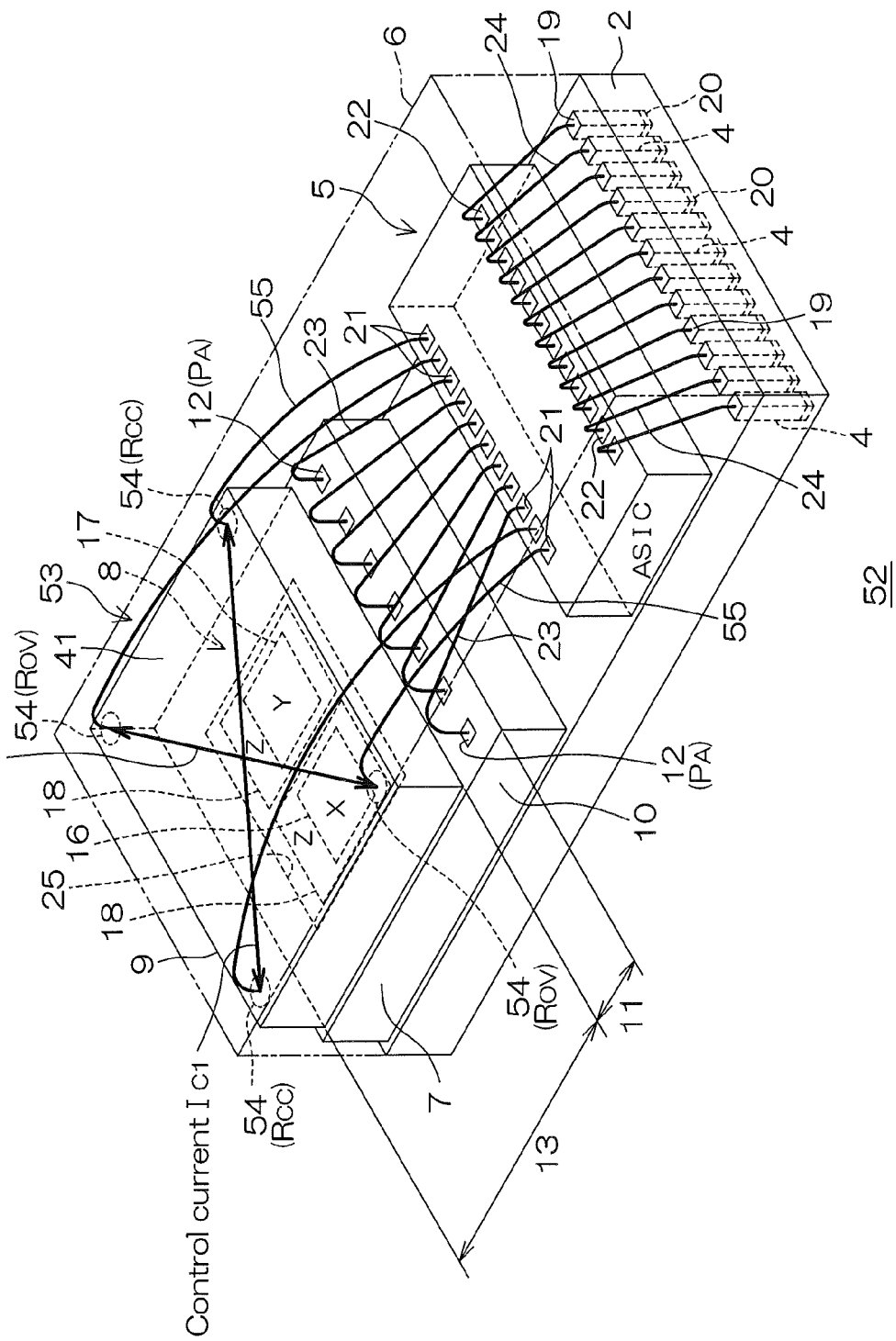
FIG. 10 is a schematic perspective view of a MEMS package according to a preferred embodiment of the present invention.
Figure 11:
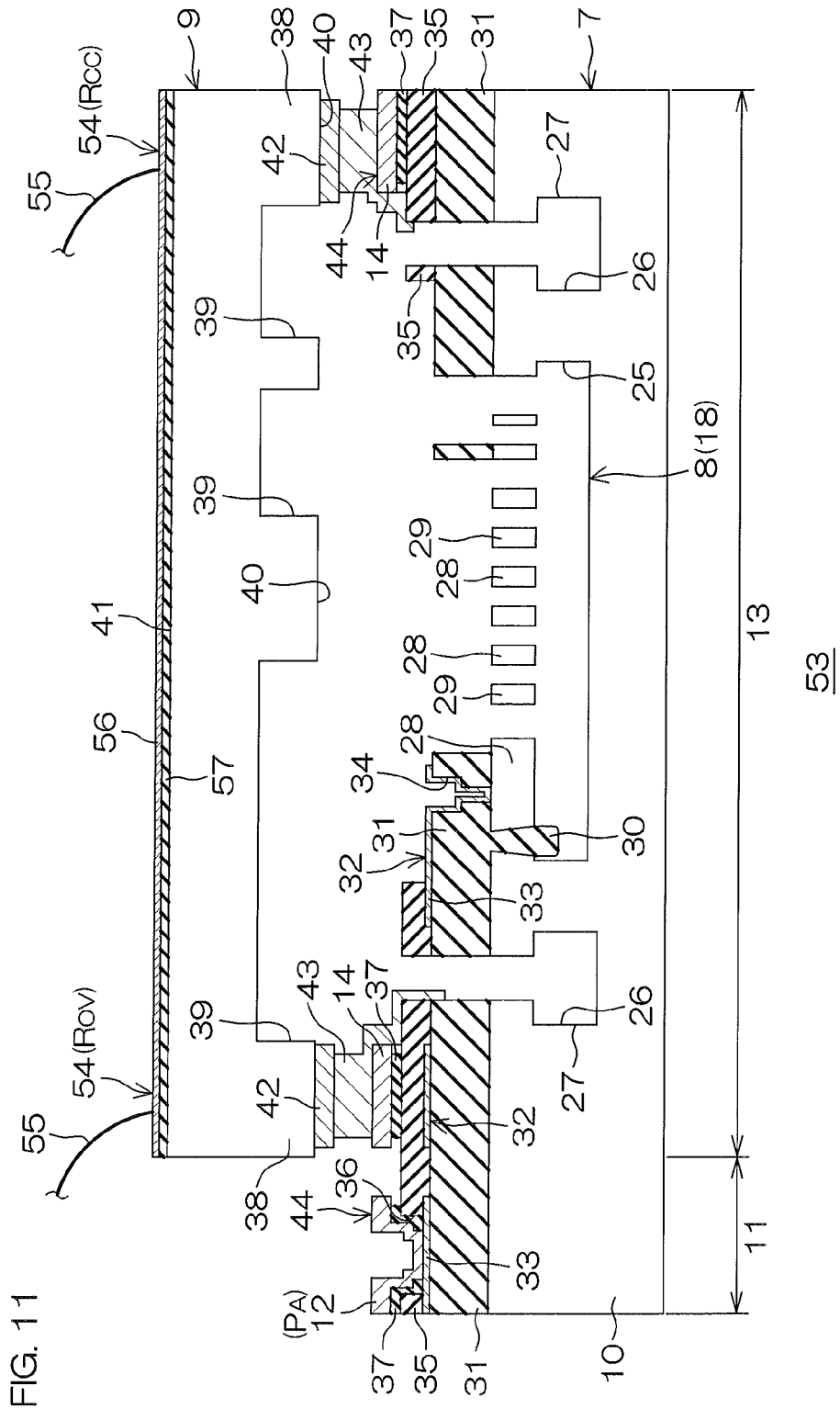
FIG. 11 is a schematic sectional view of an acceleration sensor of FIG. 10.

FIG. 10 is a schematic perspective view of a MEMS package 52 according to a preferred embodiment of the present invention. FIG. 11 is a schematic sectional view of an acceleration sensor 53 of FIG. 10. In FIG. 10 and FIG. 11, elements mutually corresponding to those in FIG. 1 and FIG. 2 are shown with the same reference symbols being attached.

With the MEMS package 52, the lid substrate 9 of the acceleration sensor 53 has a plurality of bonding regions 54 at the upper surface 41. The plurality of bonding regions 54 include a pair of regions $R_{CC}$ as an example of a pair of first wire bonding portions of the present invention arranged to make a constant current flow, and a pair of regions $R_{OV}$ as a pair of second wire bonding portions of the present invention arranged to detect an output voltage from the lid substrate 9. In the present preferred embodiment, the pair of regions $R_{CC}$ are disposed one by one directly below the endpoints of one diagonal of the lid substrate 9, and the pair of regions $R_{OV}$ are disposed one by one directly below the endpoints of the other diagonal of the lid substrate 9. The respective bonding regions 54 are directly connected to the electrode pads 21 of the integrated circuit 5 by bonding wires 55.

Also, as shown in FIG. 11, with the acceleration sensor 53, a semiconductor film 56 is formed on the upper surface 41 of the lid substrate 9. The semiconductor film 56 is formed on the entirety of the upper surface 41. The semiconductor film 56 has a thickness of, for example, 2000 Å to 10000 Å. Also, although the semiconductor film 56 is constituted of germanium in the present preferred embodiment, it may be constituted of another semiconductor, preferably a semiconductor with a lower bandgap than silicon. As a matter of course, for example, a metal film of aluminum, etc., may be used as long as it has a bandgap lower than silicon.

The acceleration sensor 53 further has an insulating film 57 between the semiconductor film 56 and the lid substrate 9. The insulating film 57 is constituted, for example, of silicon oxide.

The bonding wires 55 are bonded to the semiconductor film 56. Therefore, with the acceleration sensor 53, electrical connection with the lid substrate 9 is achieved at the semiconductor film 56. That is, with the acceleration sensor 53, a total of four bonding wires 55 are connected respectively to the pair of regions $R_{CC}$ and the pair of regions $R_{OV}$ at the semiconductor film 56 of the lid substrate 9. By this arrangement, when a control current (constant current) $I_{C1}$ is made to flow between the pair of regions $R_{CC}$, the lid substrate 9 detects a variation of magnetic field in the thickness direction of the lid substrate 9 as a detected current $I_{C2}$ based on the Hall effect as shown in FIG. 10. That is, the semiconductor film 56 can be made to function as a Hall element type magnetic sensor.

The semiconductor film 56 enables realization of a lower electron mobility than silicon by the low bandgap and can thus improve the performance of the lid substrate 9 as a magnetic sensor. Further, the insulating film 57 is formed and therefore the current input into the lid substrate 9 can be made to flow with priority to the semiconductor film 56 rather than the main body (silicon portion) of the lid substrate 9. Consequently, an occupancy ratio of the semiconductor film 56 in a current path of the magnetic sensor can be improved.

Figure 12:
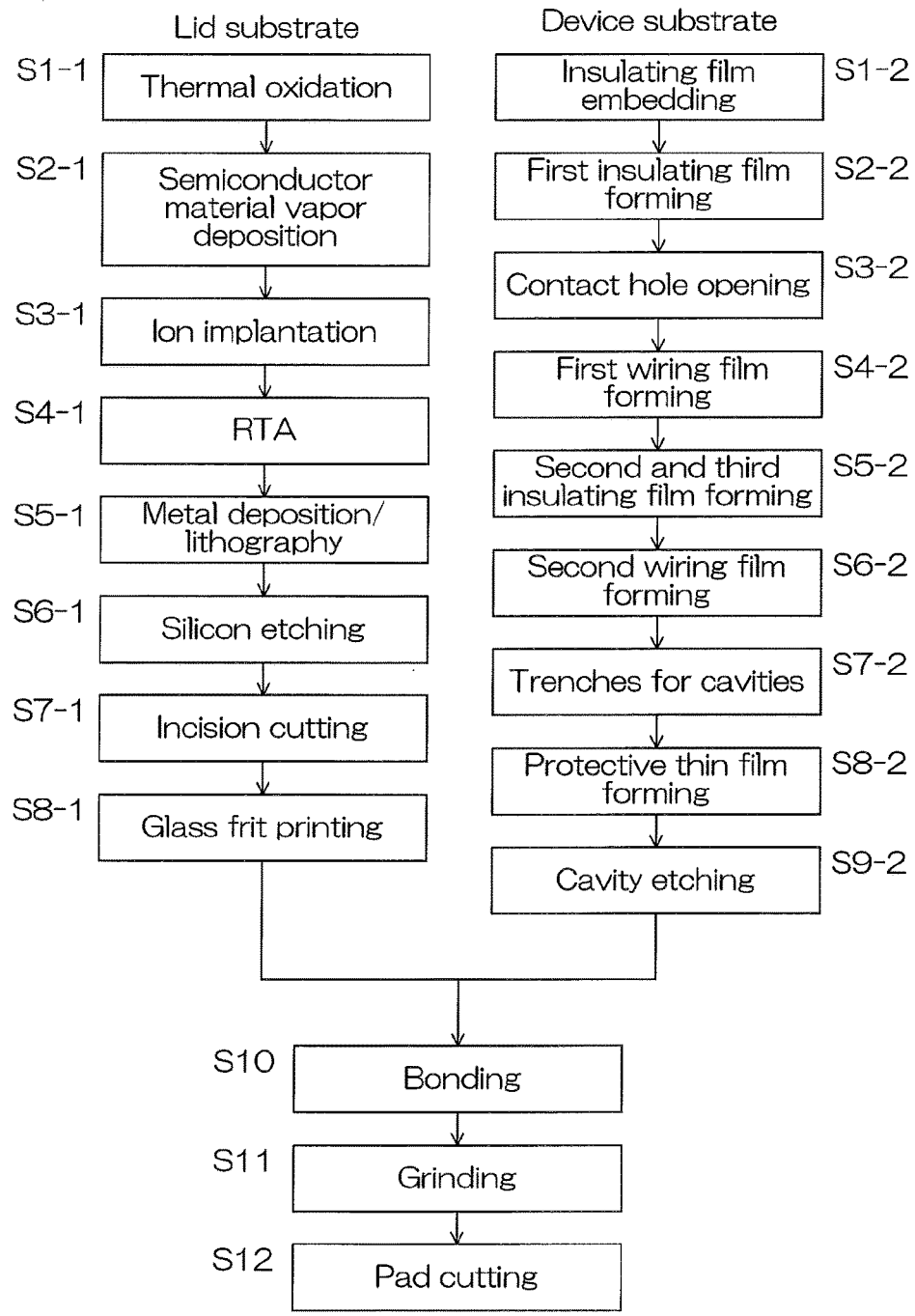
FIG. 12 is a flow diagram of an example of a process for manufacturing the acceleration sensor of FIG. 11.

FIG. 12 is a flow diagram of an example of a process for manufacturing the acceleration sensor 53 of FIG. 11. FIG. 13A to FIG. 13K are diagrams illustrating portions of the process for manufacturing the acceleration sensor 53 of FIG. 11 in the order of steps. In FIG. 13A to FIG. 13K, elements mutually corresponding to those in FIG. 5A to FIG. 5I are shown with the same reference symbols being attached.

To manufacture the acceleration sensor 53, the insulating film 57 is formed on the upper surface 41 of the lid substrate 9 by thermal oxidation (S1-1).

Figure 13A:
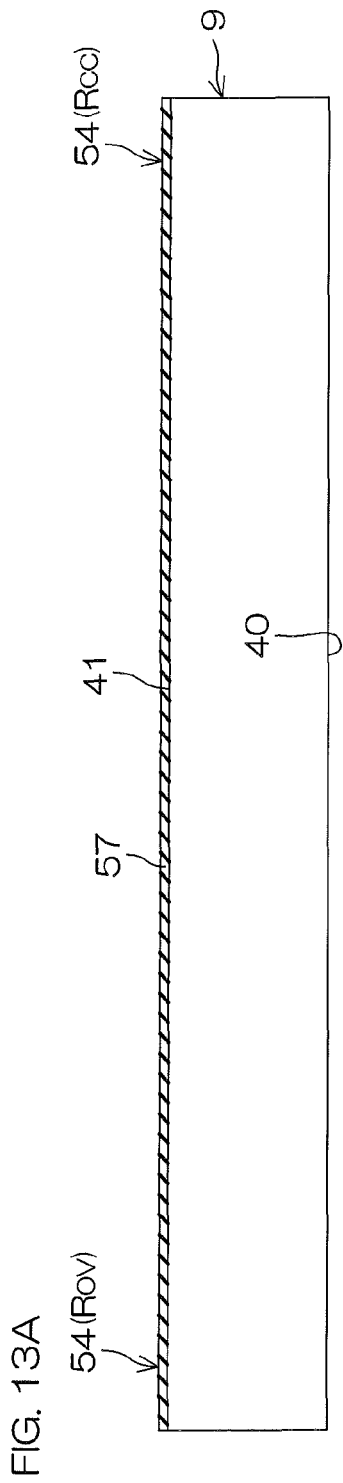
Figure 13B:
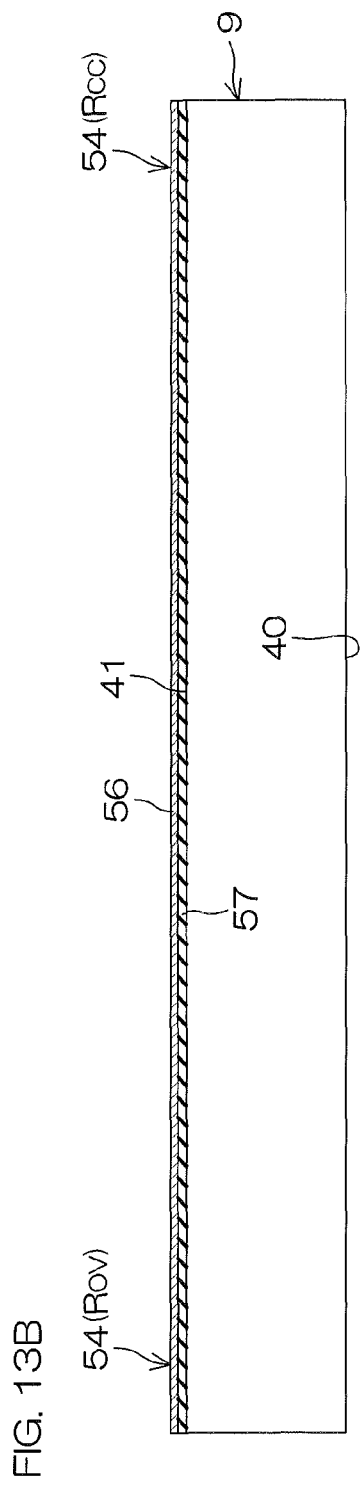

Thereafter as shown in FIG. 13B, the semiconductor film 56 is deposited on the insulating film 57 by the vapor deposition method (S2-1).

Thereafter as shown in FIG. 13C, Impurity Ions (Boron, in the present preferred embodiment) are implanted into the semiconductor film 56 (S3-1).

Figure 13D:
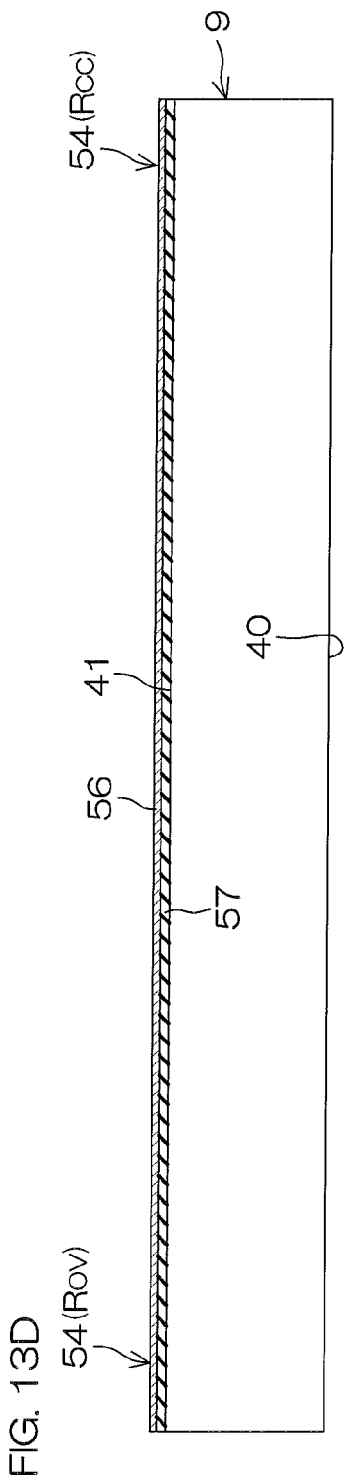

Thereafter as shown in FIG. 13D, the semiconductor film 56 is heat treated by RTA (Rapid Thermal Annealing) (S4-1). The impurity inside the semiconductor film 56 is thereby activated.

Thereafter as shown in FIG. 13E, a metal film is deposited on the lower surface 40 of the lid substrate 9, for example, by the sputtering method, and the metal film is then patterned (S5-1). The bonding pad 42 is thereby formed.

Figure 13F:
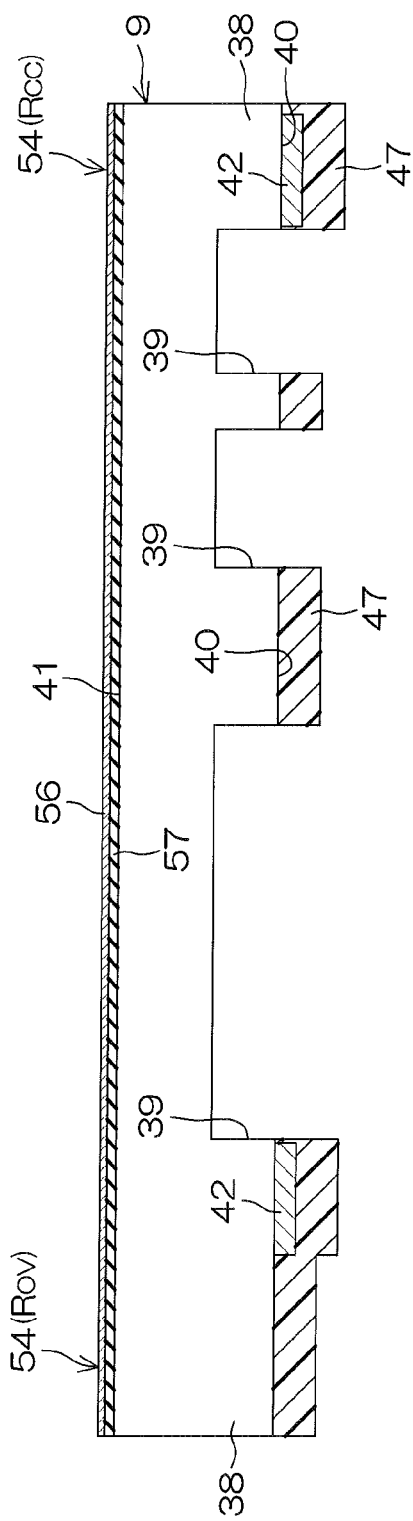

Thereafter as shown in FIG. 13F, the resist film 47 is formed selectively on the lower surface 40 of the lid substrate 9. By etching via the resist film 47, the plurality of recesses 39 are formed in the lid substrate 9 and the peripheral rim 38 is formed at the same time (S6-1).

Figure 13G:
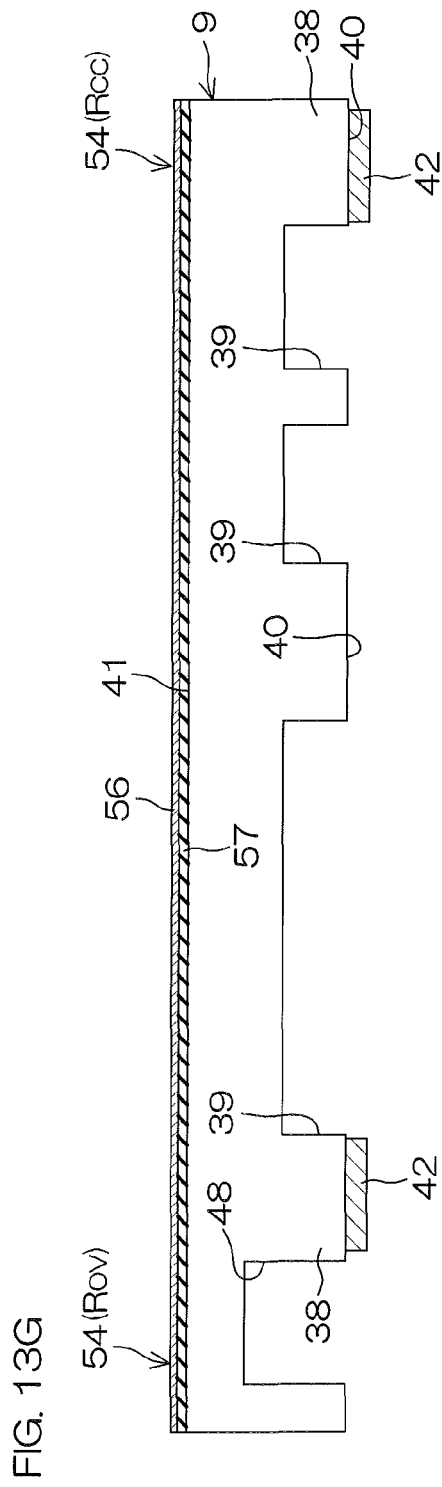

Thereafter as shown in FIG. 13G, the incision 48 is formed in a portion of the peripheral rim 38 of the lid substrate 9 by selective etching (S7-1). The incision 48 is the trench that serves as the marker when exposing the pad region 11 by cutting off the peripheral edge portion of the lid substrate 9 in a subsequent step.

Figure 13H:
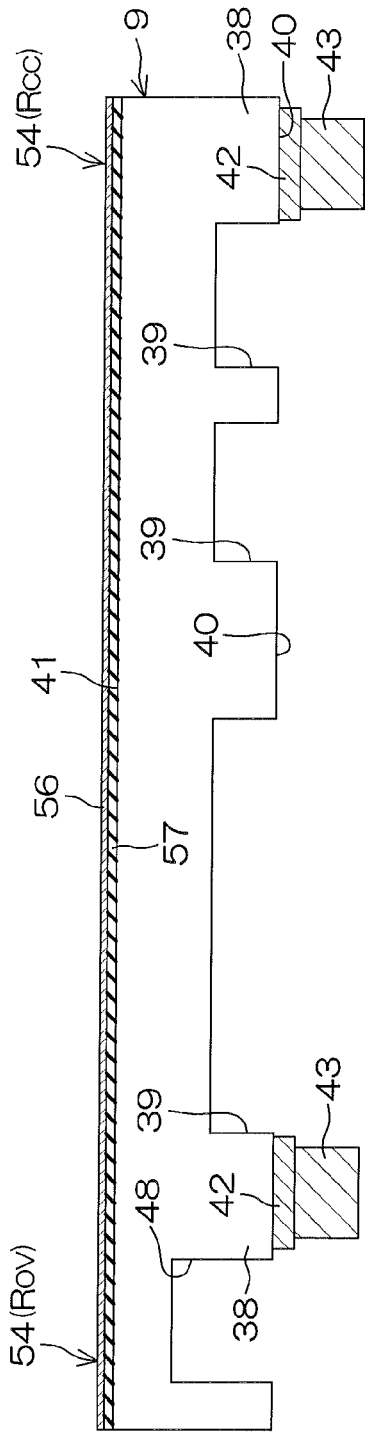

Thereafter as shown in FIG. 13H, the bonding material 43 is printed onto the peripheral rim 38 of the lid substrate (S8-1). Preparation of the lid substrate 9 is thereby completed.

Also, the sensor portion 8 is formed at the device substrate 7 either before or after or in parallel to the steps shown in FIG. 13A to FIG. 13H (S1-2 to S9-2). The preparation of the device substrate 7 is thereby completed.

Figure 13I:
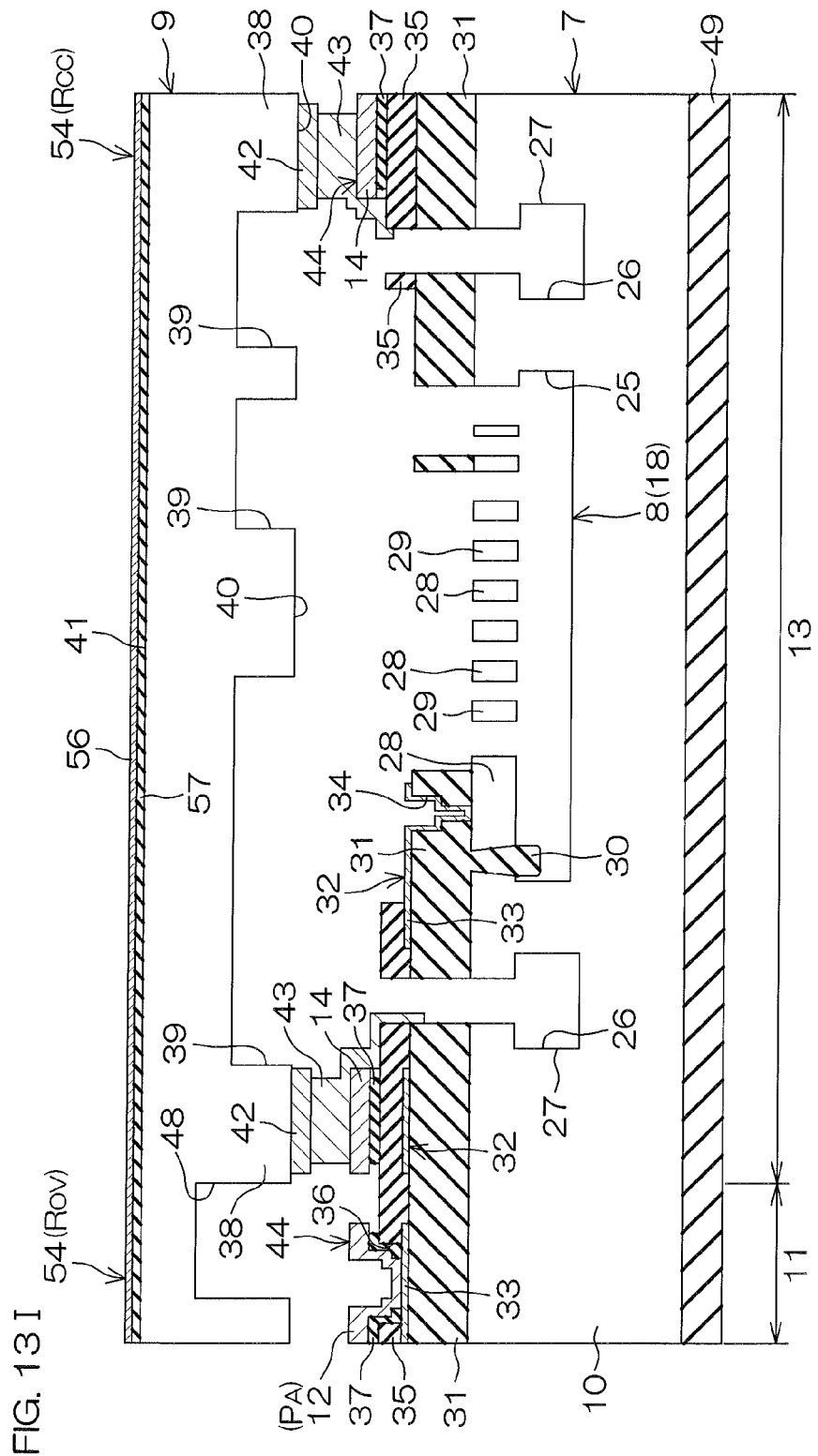

When the preparation of the lid substrate 9 (S1-1 to S8-1) and the preparation of the device substrate 7 (S1-2 to S9-2) are ended, a step of bonding the two follows. First, as shown in FIG. 13I, the lid substrate 9 is positioned with respect to the device substrate 7 and then the lid substrate 9 is pressed against it. The entirety of the bonding material 43 is thereby made to adhere closely to the device substrate 7 and the two are bonded (S10).

Figure 13J:
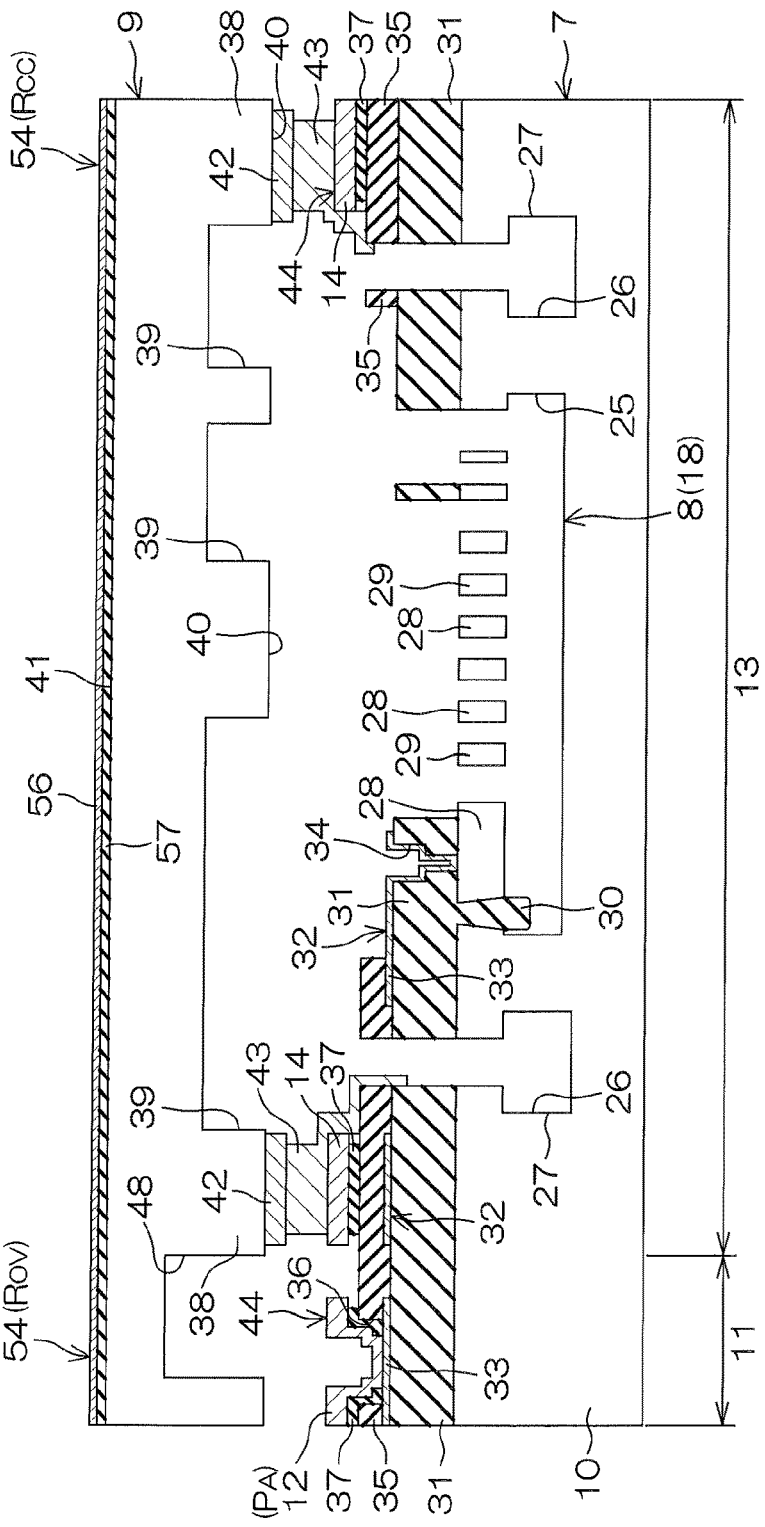

Thereafter, as shown in FIG. 13J, the device substrate 7 is ground from the back surface to completely remove the insulating film 49 and perform thinning (S11).

Figure 13K:
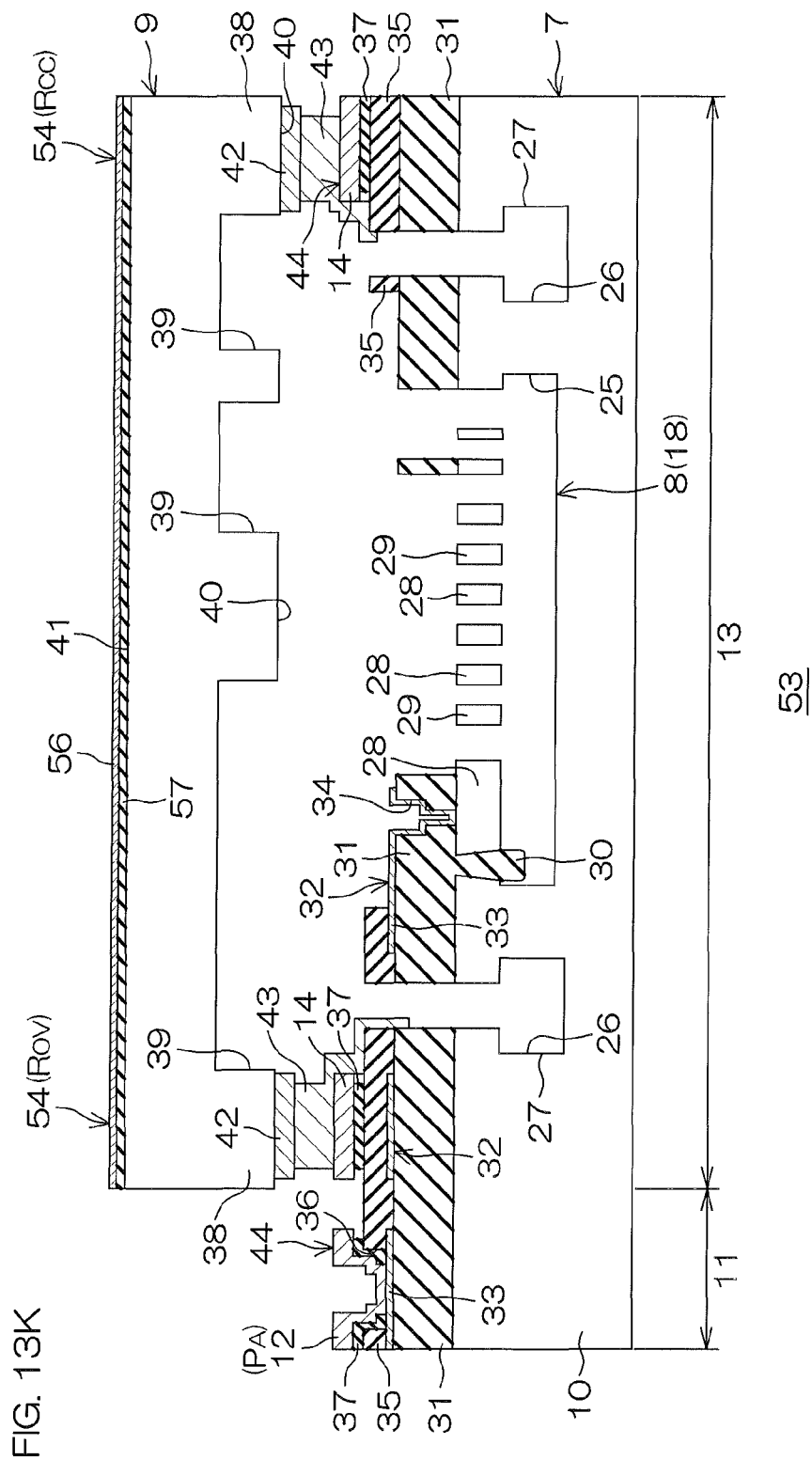

Thereafter, as shown in FIG. 13K, unnecessary portions (outer side portions of the incision 48) of the lid substrate 9 are cut off selectively to expose the pad region 11 of the device substrate 7 (S12).

The acceleration sensor 53 of FIG. 11 is obtained through the above steps.

Although preferred embodiments of the present invention have been described above, the present invention may be implemented in yet other modes.

For example, the MEMS package 1 may include an angular velocity sensor in place of the acceleration sensor 3 or in addition to the acceleration sensor 3.

Also, the constituent materials of the respective portions of the acceleration sensor, for example, the silicon oxide used as the insulating material, the aluminum used as the wiring material, etc., are merely examples used in the preferred embodiments of the present invention and may be changed as suited. For example, the insulating material may be silicon nitride, and the wiring material may be copper.

Also, the structure of the sensor portion 8 is not restricted to that of the preferred embodiments and a known MEMS structure may be applied.

Besides the above, various design modifications may be made within the scope of the matters described in the claims.

The invention claimed is:

1. A MEMS sensor, comprising:
    a base substrate including a displaceably supported movable portion; and
    a lid substrate covering the movable portion and capable of functioning as a magnetic sensor that detects magnetism by making use of the Hall effect, wherein
    the base substrate has a pair of first contact portions and a pair of second contact portions at an upper surface facing the lid substrate, and
    the pair of first contact portions and the pair of second contact portions are electrically connected to the lid substrate.

2. The MEMS sensor according to claim 1, wherein the base substrate has a plurality of first external pads disposed outside a region directly below the lid substrate and wirings lead out from the pair of first contact portions and the pair of second contact portions respectively to the plurality of first external pads.

3. The MEMS sensor according to claim 2, wherein the base substrate has a second external pad, electrically connected to the movable portion, in a pad region shared with the first external pads.

4. The MEMS sensor according to claim 1, wherein
    the lid substrate has a rectangular plate shape,
    the pair of first contact portions are disposed one by one directly below end points of one diagonal of the lid substrate, and
    the pair of second contact portions are disposed one by one directly below end points of another diagonal of the lid substrate.

5. The MEMS sensor according to claim 1, wherein the lid substrate has a pair of first wire bonding portions and a pair of second wire bonding portions on a surface opposite a lower surface that faces the base substrate.

6. The MEMS sensor according to claim 5, wherein
    the lid substrate has a rectangular plate shape,
    the pair of first wire bonding portions are disposed one by one at end points of one diagonal of the lid substrate, and
    the pair of second wire bonding portions are disposed one by one at end points of another diagonal of the lid substrate.

7. The MEMS sensor according to claim 1, wherein the lid substrate is constituted of a low-resistance semiconductor substrate.

8. The MEMS sensor according to claim 7, wherein the low-resistance semiconductor substrate is constituted of silicon.

9. The MEMS sensor according to claim 1, wherein the lid substrate has, in a plane, a conductive film having a lower bandgap than silicon.

10. The MEMS sensor according to claim 9, further comprising an insulating film disposed between the conductive film and the lid substrate.

11. The MEMS sensor according to claim 10, wherein the insulating film is constituted of silicon oxide.

12. The MEMS sensor according to claim 9, wherein the conductive film is formed on the lower surface of the lid substrate that faces the base substrate.

13. The MEMS sensor according to claim 9, wherein the conductive film is formed on the surface opposite the lower surface of the lid substrate that faces the base substrate.

14. The MEMS sensor according to claim 9, wherein the conductive film has a thickness of 2000 Å to 10000 Å.

15. The MEMS sensor according to claim 9, wherein the conductive film is constituted of a semiconductor film.

16. The MEMS sensor according to claim 15, wherein the semiconductor film is constituted of germanium.

17. The MEMS sensor according to claim 16, wherein the semiconductor film contains boron as an impurity.

18. The MEMS sensor according to claim 9, wherein the conductive film is constituted of a metal film.

19. The MEMS sensor according to claim 18, wherein the metal film is constituted of aluminum.

20. The MEMS sensor according to claim 1, wherein the base substrate includes a comb-teeth-shaped fixed electrode and a comb-teeth-shaped movable electrode as the movable portion combined with the fixed electrode.

21. A MEMS package comprising:
a MEMS sensor that includes a base substrate including a displaceably supported movable portion and a lid substrate covering the movable portion and capable of functioning as a magnetic sensor that detects magnetism by making use of the Hall effect; and
a resin package sealing the MEMS sensor, wherein
the base substrate has a pair of first contact portions and a pair of second contact portions at an upper surface facing the lid substrate, and
the pair of first contact portions and the pair of second contact portions are electrically connected to the lid substrate.

22. The MEMS package according to claim 21, further comprising a circuit device that is electrically connected to the MEMS sensor and is sealed in the resin package shared with the MEMS sensor.

23. A MEMS sensor, comprising:
a base substrate including a displaceably supported movable portion; and
a lid substrate covering the movable portion and capable of functioning as a magnetic sensor that detects magnetism by making use of the Hall effect, wherein
the lid substrate has a pair of first wire bonding portions and a pair of second wire bonding portions on a surface opposite a lower surface that faces the base substrate.

24. The MEMS sensor according to claim 23, wherein
the lid substrate has a rectangular plate shape,
the pair of first wire bonding portions are disposed one by one at end points of one diagonal of the lid substrate, and
the pair of second wire bonding portions are disposed one by one at end points of another diagonal of the lid substrate.

25. The MEMS sensor according to claim 23, wherein the lid substrate is constituted of a low-resistance semiconductor substrate.

26. The MEMS sensor according to claim 25, wherein the low-resistance semiconductor substrate is constituted of silicon.

27. A MEMS sensor, comprising:
a base substrate including a displaceably supported movable portion; and
a lid substrate covering the movable portion and capable of functioning as a magnetic sensor that detects magnetism by making use of the Hall effect, wherein
the lid substrate has, in a plane, a conductive film having a lower bandgap than silicon.

28. The MEMS sensor according to claim 27, further comprising an insulating film disposed between the conductive film and the lid substrate.

29. The MEMS sensor according to claim 28, wherein the insulating film is constituted of silicon oxide.

30. The MEMS sensor according to claim 27, wherein the conductive film is formed on the lower surface of the lid substrate that faces the base substrate.

31. The MEMS sensor according to claim 27, wherein the conductive film is formed on the surface opposite the lower surface of the lid substrate that faces the base substrate.

32. The MEMS sensor according to claim 27, wherein the conductive film has a thickness of 2000 Å to 10000 Å.

33. The MEMS sensor according to claim 27, wherein the conductive film is constituted of a semiconductor film.

34. The MEMS sensor according to claim 33, wherein the semiconductor film is constituted of germanium.

35. The MEMS sensor according to claim 34, wherein the semiconductor film contains boron as an impurity.

36. The MEMS sensor according to claim 27, wherein the conductive film is constituted of a metal film.

37. The MEMS sensor according to claim 36, wherein the metal film is constituted of aluminum.

38. The MEMS sensor according to claim 27 wherein the lid substrate is constituted of a low-resistance semiconductor substrate.

39. The MEMS sensor according to claim 38, wherein the low-resistance semiconductor substrate is constituted of silicon.

40. A MEMS sensor, comprising:
a base substrate including a displaceably supported movable portion; and
a lid substrate covering the movable portion and capable of functioning as a magnetic sensor that detects magnetism by making use of the Hall effect, wherein
the base substrate includes a comb-teeth-shaped fixed electrode and a comb-teeth-shaped movable electrode as the movable portion combined with the fixed electrode.

41. A MEMS package, comprising:
a MEMS sensor that includes a base substrate including a displaceably supported movable portion and a lid substrate covering the movable portion and capable of functioning as a magnetic sensor that detects magnetism by making use of the Hall effect; and
a resin package sealing the MEMS sensor, wherein
the lid substrate has a pair of first wire bonding portions and a pair of second wire bonding portions on a surface opposite a lower surface that faces the base substrate.

42. The MEMS package according to claim 41, further comprising a circuit device that is electrically connected to the MEMS sensor and is sealed in the resin package shared with the MEMS sensor.

43. A MEMS package, comprising:
a MEMS sensor that includes a base substrate including a displaceably supported movable portion and a lid substrate covering the movable portion and capable of functioning as a magnetic sensor that detects magnetism by making use of the Hall effect; and
a resin package sealing the MEMS sensor, wherein
the lid substrate has, in a plane, a conductive film having a lower bandgap than silicon.

44. The MEMS package according to claim 43, further comprising a circuit device that is electrically connected to the MEMS sensor and is sealed in the resin package shared with the MEMS sensor.

45. A MEMS package, comprising:
a MEMS sensor that includes a base substrate including a displaceably supported movable portion and a lid substrate covering the movable portion and capable of functioning as a magnetic sensor that detects magnetism by making use of the Hall effect; and
a resin package sealing the MEMS sensor, wherein
the base substrate includes a comb-teeth-shaped fixed electrode and a comb-teeth-shaped movable electrode as the movable portion combined with the fixed electrode.

46. The MEMS package according to claim 21, further comprising a circuit device that is electrically connected to the MEMS sensor and is sealed in the resin package shared with the MEMS sensor.

\* \* \* \* \*